United States Patent
Fujishima et al.

(10) Patent No.: US 7,005,352 B2
(45) Date of Patent: Feb. 28, 2006

(54) TRENCH-TYPE MOSFET HAVING A REDUCED DEVICE PITCH AND ON-RESISTANCE

(75) Inventors: Naoto Fujishima, Nagano (JP); Akio Sugi, Nagano (JP); C. Andre T. Salama, Toronto (CA)

(73) Assignee: Fuji Electric Co., Inc., (JP)

( * ) Notice: Subject to any disclaimer, the term of this patent is extended or adjusted under 35 U.S.C. 154(b) by 0 days.

(21) Appl. No.: 10/896,250

(22) Filed: Jul. 21, 2004

(65) Prior Publication Data

US 2004/0256666 A1 Dec. 23, 2004

Related U.S. Application Data

(62) Division of application No. 10/103,543, filed on Mar. 21, 2002, now Pat. No. 6,781,197.

(30) Foreign Application Priority Data

Mar. 21, 2001 (JP) .............................. 2001-081243

(51) Int. Cl.
*H01L 21/336* (2006.01)
(52) U.S. Cl. ..................... 438/270; 438/272; 438/273; 438/274; 438/589
(58) Field of Classification Search ........ 438/270–274, 438/589; 257/329, 330, 341, 342
See application file for complete search history.

(56) References Cited

U.S. PATENT DOCUMENTS

| | | | |
|---|---|---|---|
| 5,122,848 A | 6/1992 | Lee et al. .................. | 357/23.6 |
| 6,316,807 B1 | 11/2001 | Fujishima et al. .......... | 257/333 |
| 6,624,470 B1 | 9/2003 | Fujishima .................. | 257/331 |
| 6,639,274 B1 | 10/2003 | Fujishima .................. | 257/330 |
| 6,664,163 B1 | 12/2003 | Fujishima et al. .......... | 438/270 |
| 6,781,197 B1 | 8/2004 | Fujishima et al. .......... | 257/329 |

FOREIGN PATENT DOCUMENTS

JP 11-224950 A 8/1999

OTHER PUBLICATIONS

"A 0.35 μm CMOS based smart power technology for 7V-50V applications"; V. Parthasarathy et al.; ISPSD'2000 Copyright 2000 by the IEEE; Catalog No. 00CH37094C; 4 pages.

Xu, Shuming et al.; "Bidirectional LIGBT on SOI Substrate with High Frequency and High Temperature Capability"; 1997, IEEE, pp. 37-40.

*Primary Examiner*—Minh-Loan Tran
(74) *Attorney, Agent, or Firm*—Rossi, Kimms & McDowell, LLP

(57) ABSTRACT

A trench-type lateral power MOSFET is manufactured by forming an n⁻-type diffusion region, which will be a drift region, on a p⁻-type substrate; selectively removing a part of substrate and a part of n⁻-type diffusion region to form trenches; forming a gate oxide film of 0.05 μm in thickness in each trench; forming a polycrystalline silicon gate layer on gate oxide film; forming a p⁻-type base region and an n⁺-type diffusion region, which will be a source region, in the bottom of each trench; and forming an n⁺-type diffusion region, which will be a drain region, in the surface portion of n⁻-type diffusion region. The MOSFET has reduced device pitch, a reduced on-resistance per unit area and a simplified manufacturing process.

3 Claims, 24 Drawing Sheets

US 7,005,352 B2

TRENCH-TYPE MOSFET HAVING A REDUCED DEVICE PITCH AND ON-RESISTANCE

This is a Division of application Ser. No. 10/103,543 filed Mar. 21, 2002 now U.S. Pat. No. 6,781,197.

FIELD OF THE INVENTION

The invention relates to power MOSFETs with low on-resistance used in ICs with a high breakdown voltage which control a high current such as an IC for a switching power supply, an IC for driving the power system of an automobile, and an IC for driving a flat panel display. The invention relates also to the method of manufacturing the semiconductor devices described above.

BACKGROUND OF THE INVENTION

Recently, portable instruments have been used widely, and intelligent communication technologies have been developed. In association with these trends, power integrated circuits (Ics) which incorporate power metal oxide semiconductor field effect transistors (MOSFETs) have become one of the very important components. The conventional power IC combines a discrete power MOSFET and a control and drive circuit. In contrast, the new power IC developed recently integrates lateral power MOSFETs into a control circuit. It is required for the new power IC to reduce the size, the electric power consumption and the manufacturing costs thereof, and to improve the reliability. To meet these requirements, research and development of lateral power MOSFETs exhibiting a high breakdown voltage and based on the CMOS process has been explored vigorously.

FIG. 22 is a cross sectional view of a conventional lateral power MOSFET for the breakdown voltage of 30 V. Referring now to FIG. 22, the lateral power MOSFET 101 includes a p$^-$-type substrate 10, a p$^-$-type well 11 on p$^-$-type substrate 10, a p$^+$-type diffusion region 16 in a first surface portion of p$^-$-type well 11, an n$^+$-type diffusion region 17 in a second surface portion of p$^-$-type well 11, an n$^-$-type drift region 18 in a third surface portion of p$^-$-type well 11, an n$^+$-type diffusion region 19 in the surface portion of n$^-$-type drift region 18, a gate oxide film 12 on p$^-$-type well 11 and n$^-$-type drift region 18, a gate electrode 13 on gate oxide film 12, a source electrode 14 on p$^+$-type diffusion region 16 and n$^+$-type diffusion region 17, and a drain electrode 15 on n$^+$-type diffusion region 19.

The lateral power MOSFET as described above is subject to certain limitations in minimizing the structure thereof for sustaining the punch-through breakdown voltage, since the expanded drains for sustaining the breakdown voltage and the channels are formed in the surface portion of the semiconductor chip. Since drift regions 18 and the channels are formed along the surface of the semiconductor chip, it is difficult to integrate a number of unit devices into a single chip. Since it is difficult to widen the channel width, there is a limitation in reducing the on-resistance per unit area.

Many lateral power MOSFETs have been proposed. "A 0.35 $\mu$m CMOS based smart power technology for 7 V–50 V applications", V. Parthasarathy et al., Proceedings of ISPSD, (2000), incorporated herein by reference, describes a lateral power MOSFET, the breakdown voltage thereof is 44 V and the on-resistance per unit area thereof is 30 m$\Omega$/mm$^2$. The estimated device pitch (the distance between the centers of the source and the drain) of this MOSFET for the 0.35 $\mu$m rule is around 3.6 $\mu$m. The 0.35 $\mu$m rule refers to the fundamental design rule for designing an integrated circuit in which the minimum dimension for the mask pattern is 0.35 $\mu$m. However, the device pitch becomes wider with increase of the breakdown voltage, since the dimensions of the drift region become larger.

The MOSFET having a trench structure as shown in FIG. 23 (hereinafter referred to as a "trench-type MOSFET") facilitates reducing the device pitch to increase the number of unit devices integrated (cf. U.S. Pat. No. 5,122,848 incorporated herein by reference). Referring now to FIG. 23, the conventional trench-type MOSFET 102 includes trenches 21 formed from the surface of a p$^-$-type substrate 20, a gate oxide film 22 covering the inner side walls of each trench 21, a gate electrode 23 on the inner side of gate oxide film 22, an n$^+$-type diffusion region 27 working as a source region in the bottom of trench 21, and an n$^+$-type diffusion region 29 working as a drain region on substrate 20 and around trench 21.

In FIG. 23, a source electrode 24, a drain electrode 25, and an oxide film 26 are shown. The n$^+$-type diffusion region 29 (drain region) on substrate 20 and the upper end portion of gate electrode 23 are at the same level with gate oxide film 22 interposed therebetween. Due to this arrangement, the breakdown voltage of the trench-type MOSFET illustrated in FIG. 23 is up to 10 V. It is difficult for the illustrated trench-type MOSFET to obtain a breakdown voltage of more than 10 V. The p$^-$-type substrate 20 tends to be punched through easily, since p$^-$-type substrate 20 is used as a channel region. Since the resistance of p$^-$-type substrate 20 is high, the potential of p$^-$-type substrate 20 rises when a leakage current flows in p$^-$-type substrate 20. The leakage current flows into source region 27. The leakage current works as a base current of the parasitic transistor formed of source region 27, substrate 20 and drain region 29, sometimes causing secondary breakdown.

The inventors of the present invention have proposed a lateral power MOSFET employing the trench structure as described above (hereinafter referred to as a "trench-type lateral power MOSFET") in "A trench lateral power MOSFET using self-aligned trench bottom contact holes", IEDM '97, Digest, pp. 359–362 (1997), incorporated herein by reference. FIG. 24 is a cross sectional view of the conventional trench-type lateral power MOSFET.

Referring now to FIG. 24, the conventional trench-type lateral power MOSFET 103 includes trenches 31 formed from the surface of a p$^-$-type substrate 30, a gate electrode 33 in each trench 31, an n$^+$-type diffusion region 37 working as a source region around trench 31, and an n$^+$-type diffusion region 39 working as a drain region in the bottom of trench 31. The n$^+$-type diffusion region 39 (drain region) is surrounded by an n$^-$-type region 38 (n$^-$-type drain region) surrounding the lower half of trench 31. The n$^-$-type region 38 is surrounded by a p$^-$-type diffusion region 41 working as a p-type mass.

A p$^+$-type diffusion region 42 is around n$^+$-type diffusion region 37 (source region). A p-type base region 43 is below p$^+$-type diffusion region 42 and n$^+$-type diffusion region 37. A thick oxide film 44 is disposed in the lower half of trench 31 to sustain the breakdown voltage of the MOSFET. A source electrode 34, a drain electrode 35, and an oxide film 36 are shown in FIG. 24. The on-resistance per unit area of the trench-type lateral power MOSFET is 80 m$\Omega$/mm$^2$, and the breakdown voltage thereof is 80 V. The device pitch is 4 $\mu$m, which is about half the device pitch of the conventional lateral power MOSFET, the breakdown voltage thereof is 80 V.

When employing a trench structure for narrowing the device pitch of a lateral power MOSFET, it is preferable for to have a breakdown voltage of, for example, 30 V, which is lower than the above referenced value of 80 V. However, the trench-type lateral power MOSFET described above has a structure suitable for a breakdown voltage of 80 V. Application of the above described structure of the trench-type lateral power MOSFET to the MOSFETs, the breakdown voltage thereof is lower than 80 V, poses the following problems. The thickness of the oxide film 44 for a breakdown voltage of less than 80 V is thinner than that of an oxide film for a breakdown voltage of 80 V. If oxide film 44 is not too thick but thick enough to sustain the breakdown voltage lower than 80 V, the dimensions of the MOSFET will be further reduced. If the oxide film 44 having the thickness for the breakdown voltage of 80 V is used in the MOSFET for the breakdown voltage of lower than 80 V, disadvantageous characteristics including high wiring resistance in the periphery of the device will be caused, since the total dimensions of the resulting device is larger than those of the device including oxide film 44, the thickness thereof is optimized.

Since the gate area of the MOSFET which employs oxide film 44 for the breakdown voltage of 80 V is wider than the gate area of the MOSFET which employs oxide film having optimized thickness, high parasitic capacitance and drive loss increase are caused. In manufacturing conventional trench-type lateral power MOSFETs, shallow trenches are formed at first in $p^-$-type substrate 30 and, then, deep trenches are dug from the shallow trenches. Therefore, the process for manufacturing the conventional trench-type lateral power MOSFET is complicated, and the throughput for manufacturing the conventional trench-type lateral power MOSFETs is lower.

In view of the foregoing, it would be desirable to provide a semiconductor device including a trench-type lateral power MOSFET with a breakdown voltage of lower than 80 V and manufactured through a process simpler than the process for manufacturing the conventional trench-type lateral power MOSFET, the breakdown voltage thereof is 80 V. In addition, it would be desirable to provide a semiconductor device including a trench-type lateral power MOSFET with a breakdown voltage of lower than 80 V, the device pitch thereof is narrower than the device pitch in the conventional trench-type lateral power MOSFET, the breakdown voltage thereof is 80 V, and the on-resistance per unit area thereof is lower than the on-resistance per unit area of the conventional trench-type lateral power MOSFET. Still further, it would be desirable to provide a method of manufacturing the semiconductor device including a trench-type lateral power MOSFET with a breakdown voltage of lower than 80 V.

SUMMARY OF THE INVENTION

According to the invention, there is provided a trench-type lateral power MOSFET manufactured by forming an $n^-$-type drift region on a $p^-$-type semiconductor substrate, selectively removing a part of the semiconductor substrate and a part of the $n^-$-type drift region to form trenches, forming a gate insulation film of 0.05 $\mu$m in thickness in each trench, forming a polycrystalline silicon gate layer on the gate insulation film, forming a $p^-$-type base region and an $n^+$-type source region in the bottom of the trench; and forming an $n^+$-type drain region in the surface portion of the drift region.

In the trench-type lateral power MOSFET according to the invention, the drift region and the channel region, which should be spaced apart from each other for a certain spacing to obtain a high breakdown voltage, are aligned vertically alongside the trench, and the device pitch is determined by the spacing between the centers of the source contact region and the drain contact region. The gate area and the device pitch of the trench-type lateral power MOSFET according to the invention, which does not include any thick oxide film for obtaining a high breakdown voltage, are narrower than those of the conventional trench-type lateral power MOSFET for the breakdown voltage of 80 V, which includes a thick oxide. The method of manufacturing the trench-type lateral power MOSFET according to the invention, which conducts etching for digging the trenches once, is simpler than the method of manufacturing the conventional trench-type lateral power MOSFET for the breakdown voltage of 80 V, which conducts etching for digging the trenches twice.

BRIEF DESCRIPTION OF THE DRAWINGS

The invention will now be described with reference to certain preferred embodiments thereof and the accompanying drawings, wherein.

DETAILED DESCRIPTION OF THE INVENTION

Now the invention will be explained in detail hereinafter with reference to the accompanied drawing figures which illustrate the preferred embodiments of the invention.

Although the first conductivity type is a p-type and the second conductivity type is an n-type in the following descriptions, the invention is applicable to semiconductor devices, in which the first conductivity type is an n-type and the second conductivity type is a p-type.

Figure 1:
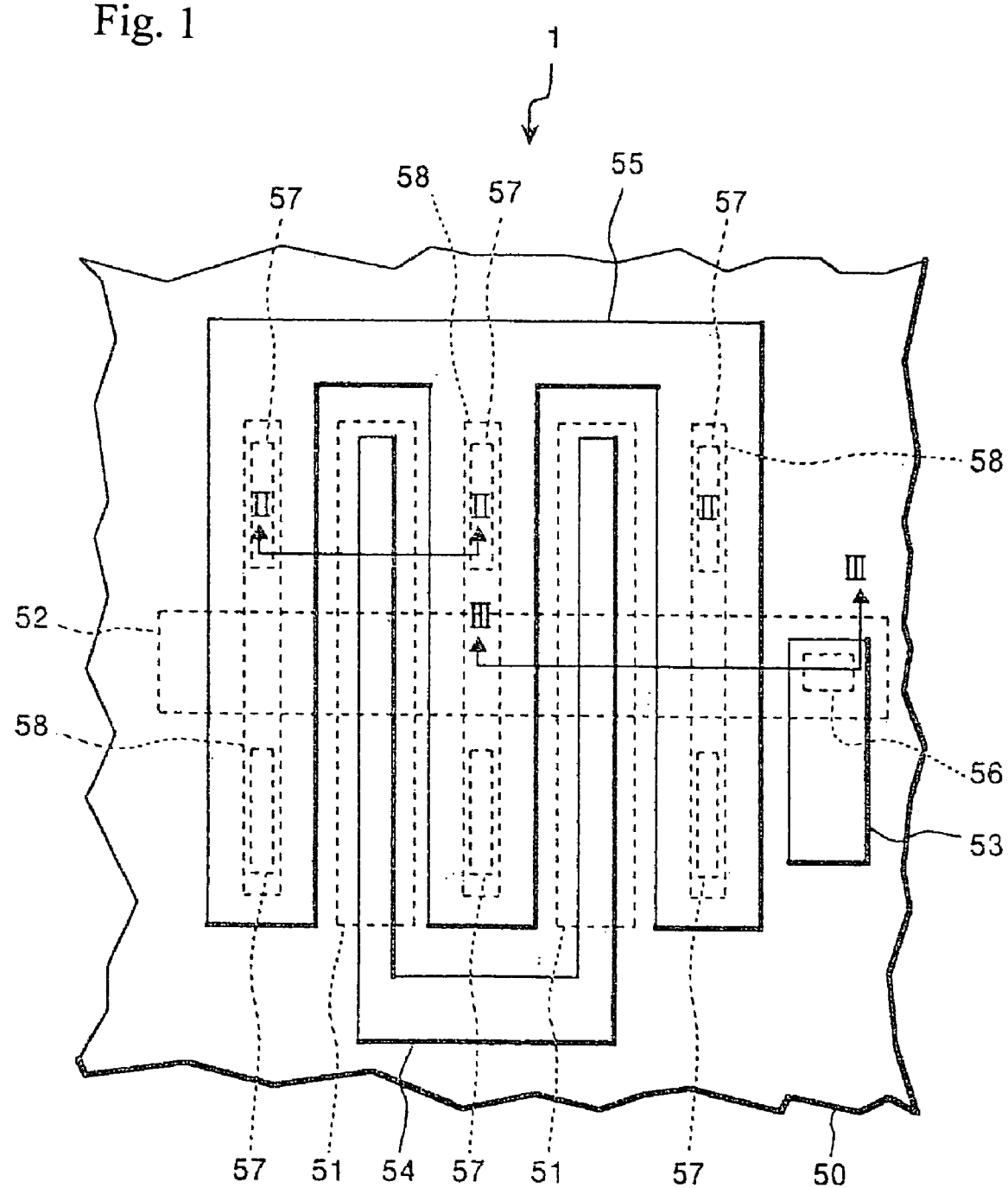
FIG. 1 is a top plan view of a trench-type lateral power MOSFET according to a first embodiment of the invention.

FIG. 1 is a top plan view of a trench-type lateral power MOSFET according to a first embodiment of the invention.

Referring now to FIG. 1, the trench-type lateral power MOSFET 1 includes a plurality of trenches 51 dug from the surface of a p⁻-type substrate 50. Each trench is shaped with a stripe in a plane parallel to the major surface of the substrate 50. A polycrystalline silicon gate layer 52 is formed such that gate layer 52 crosses trenches 51. A gate electrode 53, a comb-tooth-shaped source electrode 54 and a comb-tooth-shaped drain electrode 55 are formed on p⁻-type substrate 50.

Figure 2:
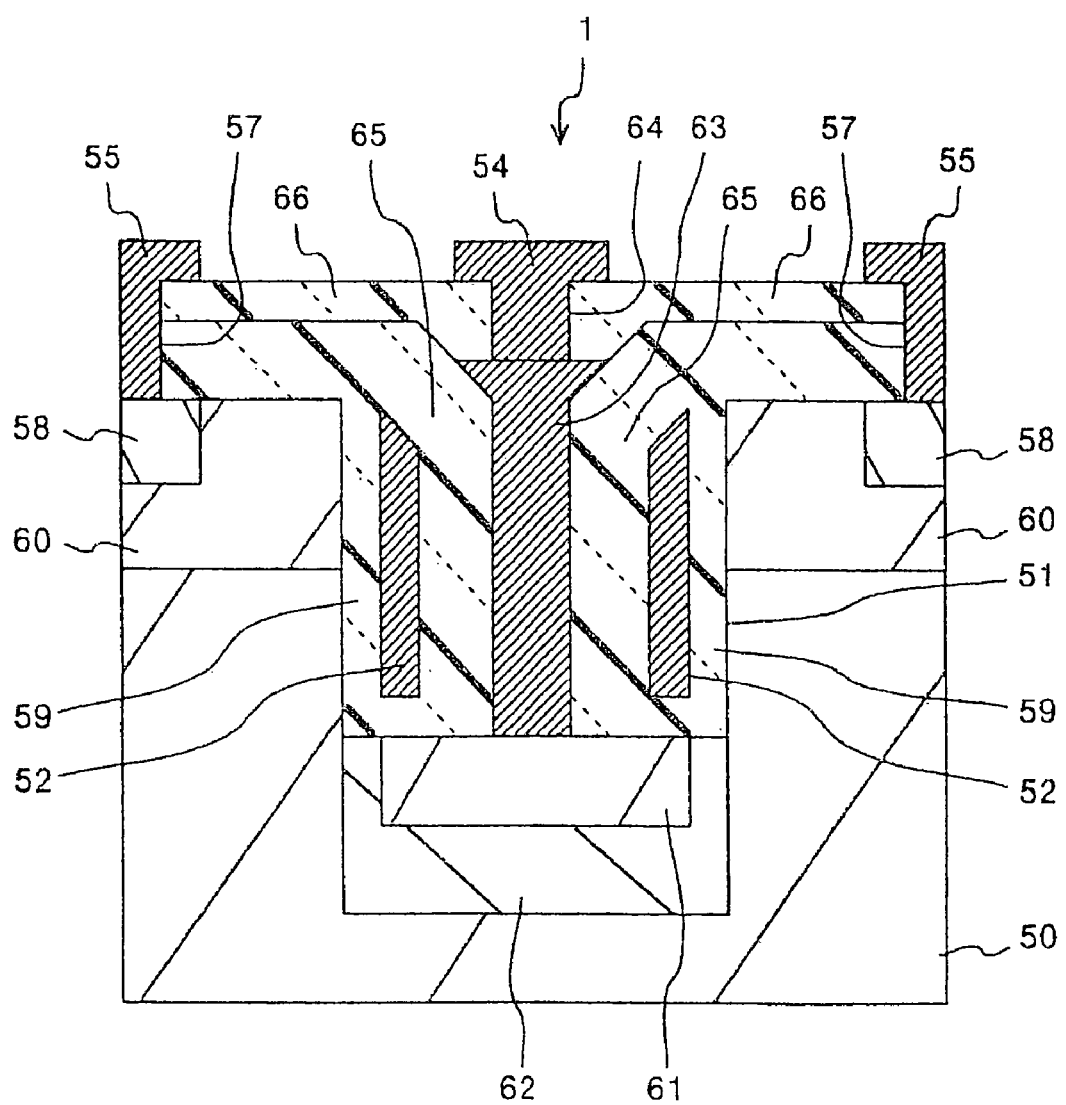
FIG. 2 is a cross section along II—II of FIG. 1.

Polycrystalline silicon gate layer 52 is connected electrically to gate electrode 53 via a gate contact region 56. Although not shown in FIG. 1, source electrode 54 is connected electrically to polycrystalline silicon layers formed in respective trenches 51 via contact regions dedicated to connecting source electrode 54. As shown in FIG. 2, the polycrystalline silicon layer in trench 51 is connected electrically to an n⁺-type diffusion region 61 working as a source region in the bottom of trench 51. Drain electrode 55 is connected electrically to n⁺-type diffusion regions 58, each working as a drain region, via drain contact regions 57.

Now the cress sectional structure of the active region, which drives the current, of the MOSFET according to the first embodiment will be described with reference to FIG. 2. FIG. 2 is a cross section along II—II of FIG. 1.

A gate oxide film 59 with uniform thickness is along the inner side walls of trench 51. Gate oxide film 59 also covers the bottom of trench 51. Polycrystalline silicon gate layer 52, which is a first electrical conductor, extends from the top to the bottom of trench 51 along the side walls of trench 51. Polycrystalline silicon gate layer 52 is extended to a gate region described later with reference to FIG. 3.

An n⁻-type diffusion region 60 working as an n⁻-type drift region surrounds the upper half of trench 51. The n⁺-type diffusion region 58 working as the drain region is in n⁻-type diffusion region 60. An n⁺-type diffusion region 61 working as a source region is in the bottom of trench 51. A p⁻-type base region 62 which surrounds n⁺-type diffusion region 61 is also in the bottom of trench 51. The p⁻-type base region 62 is as wide as trench 51.

The n⁺-type diffusion region (source region) 61 is connected electrically to source electrode 54 via a polycrystalline silicon layer 63, which is a second electrical conductor, and a source contact region 64. Polycrystalline silicon layer 63 is insulated from polycrystalline silicon gate layer 52 by an interlayer insulation film 65 in trench 51. Interlayer insulation film 65 covers n⁻-type diffusion region (n⁻-type drift region) 60 and n⁺-type diffusion region (drain region) 58. An interlayer insulation film 66 is deposited on interlayer insulation film 65. A source contact region 64 is formed through interlayer insulation film 66. A drain contact region 57 is formed through interlayer insulation films 65 and 66.

Figure 3:
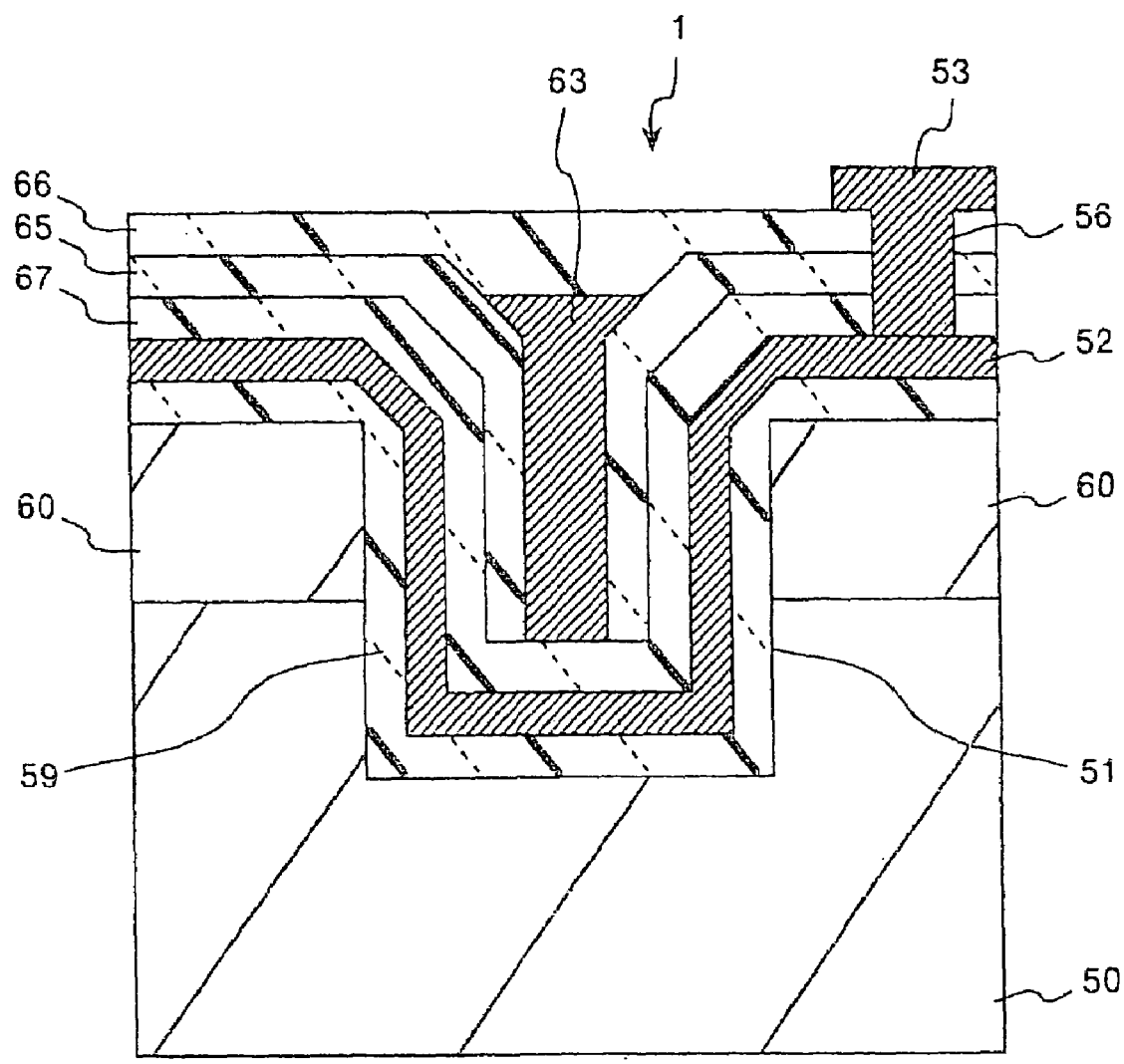
FIG. 3 is a cross section along III—III of FIG. 1.

Now the cross sectional structure including the gate region for leading out polycrystalline silicon gate layer 52 onto the substrate surface will be described with reference to FIG. 3. FIG. 3 is a cross section along III—III of FIG. 1.

The n⁻-type diffusion region 60 surrounds the upper half of trench 51. Gate oxide film 59 with uniform thickness covers the inner surfaces including the bottom surface of trench 51. Gate oxide film 59 also covers n⁻-type diffusion region 60. Polycrystalline silicon gate layer 52 is formed on gate oxide film 59 along the inner surfaces of trench 51 and the substrate surface.

An interlayer insulation film 67 is deposited on polycrystalline silicon gate layer 52. Interlayer insulation films 65 cover interlayer insulation film 67. Polycrystalline silicon layer 63 is between interlayer insulation films 65. Interlayer insulation film 66 is deposited on polycrystalline silicon layer 63 and interlayer insulation films 65. A gate contact region 56 is formed through interlayer insulation films 66, 65, and 67.

Typical dimensions and surface impurity concentrations for the respective constituent regions and layers are as follows, although they are not limited to the values described below.

Trench 51 is 2 $\mu$m in depth and 3 $\mu$m in width. Trenches 51 are arranged at a pitch of 3 $\mu$m. The diffusion depth of n⁻-type diffusion region (n⁻-type drift region) 60 is 2 $\mu$m. The surface impurity concentration of n⁻-type diffusion region 60 is $2\times10^{16}$ cm⁻².

The diffusion depth is 0.2 $\mu$m for n⁺-type diffusion region (drain region) 58 and for n⁺-type diffusion region (source region) 61. The surface impurity concentration is $1\times10^{20}$ cm⁻² for n⁺-type diffusion region 58 and for n⁺-type diffusion region 61. Gate oxide film 59 is 0.05 $\mu$m in thickness. Polycrystalline silicon gate layer 52 is 0.3 $\mu$m in thickness. The diffusion depth of p⁻-type base region 62 is 1 $\mu$m. The surface impurity concentration of p⁻-type base region 62 is $1\times10^{18}$ cm⁻².

Now the process for manufacturing trench-type lateral power MOSFET 1 according to the invention will be described. FIGS. 4 through 15 are cross sectional views describing the steps of manufacturing a trench-type lateral power MOSFET according to a second embodiment of the invention. Throughout these figures, the manufacturing process is described in connection with one trench 51. As previously stated, dimensions and surface impurity concentrations for the respective constituent regions and layers are not limited to the typical values described below.

Figure 4:
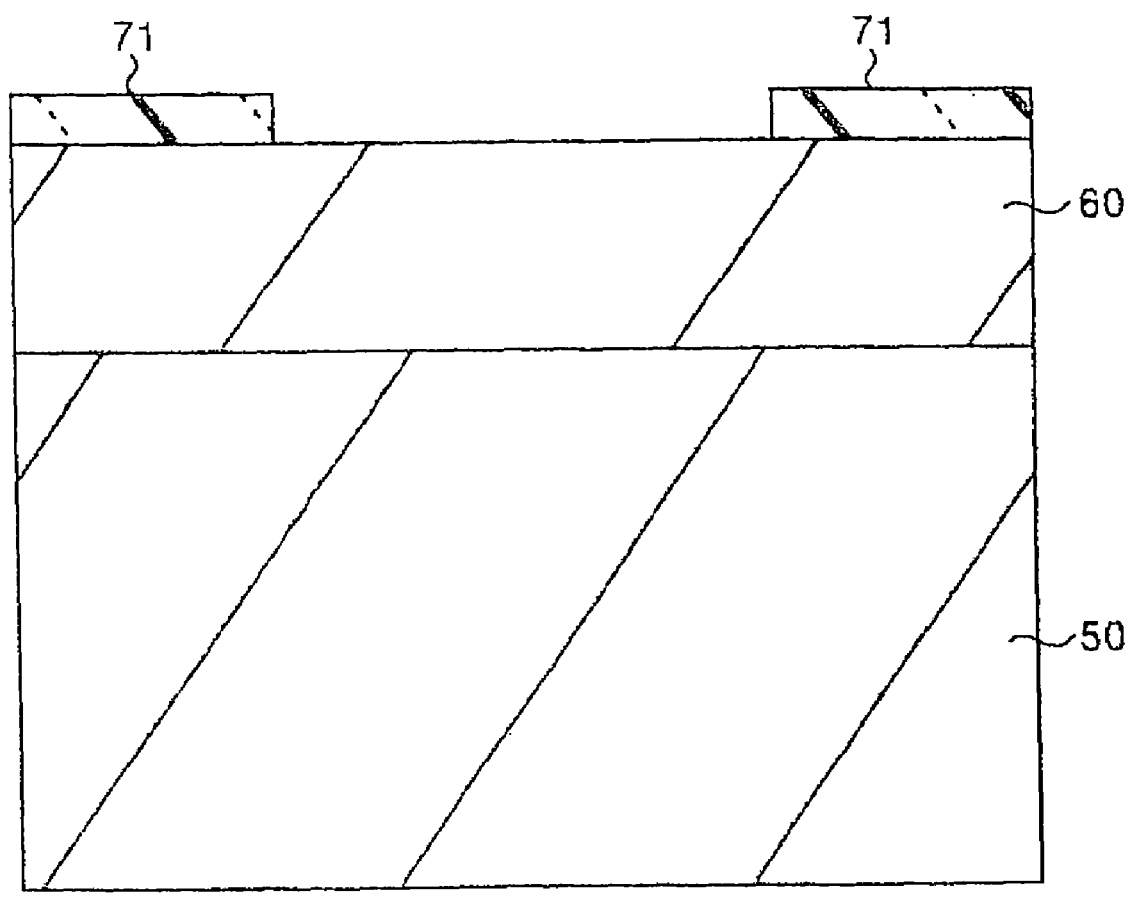
FIGS. 4 through 15 are cross sectional views describing the method of manufacturing a trench-type lateral MOSFET according to a second embodiment of the invention.

Referring now to FIG. 4, an n⁻-type diffusion region (n⁻-type drift region) 60 is formed on a p⁻-type substrate 50, the specific resistance thereof is 12Ω cm. The diffusion depth of the resulting diffusion region 60 is 1 $\mu$m and the surface impurity concentration of diffusion region 60 is $3\times10^{16}$ cm⁻². An oxide mask film 71 of 1 $\mu$m in thickness is grown on n⁻-type diffusion region 60. A window for forming a trench is opened by selectively removing a part of oxide mask film 71.

Figure 5:
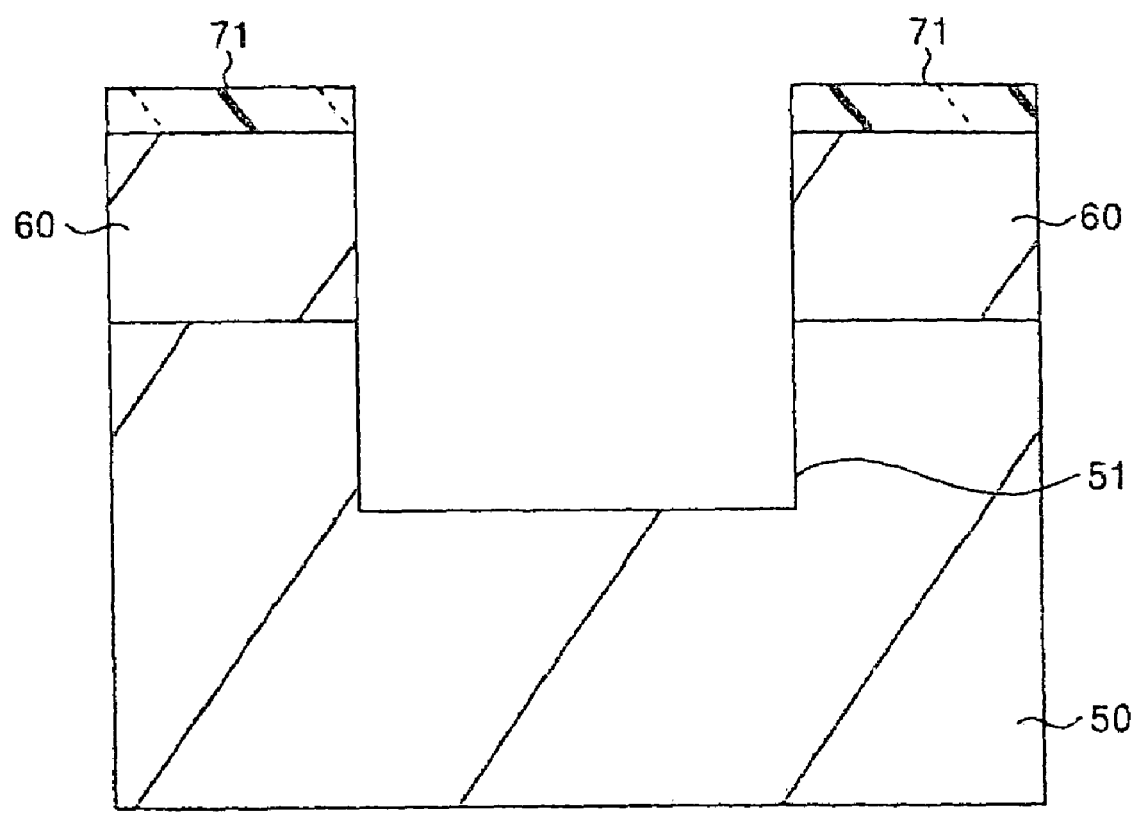

Referring now to FIG. 5, trenches 51 of 3 $\mu$m in width are formed at a pitch of 3 $\mu$m by RIE (reactive ion etching) using the patterned oxide film 71 as a mask.

Figure 6:
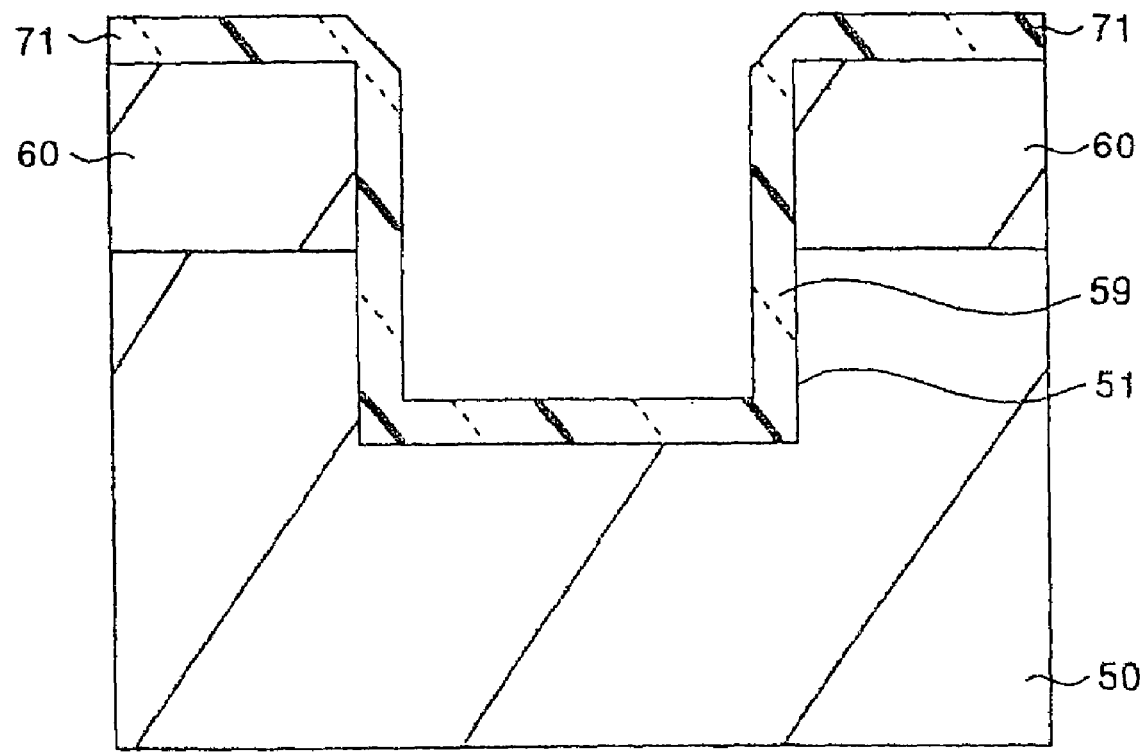

Referring now to FIG. 6, the deposits caused on the side walls of trench 51 by the etching of trench 51 are removed. The side walls of trench 51 are cleaned by sacrificial oxidation. Then, a gate oxide film 59 of 0.05 $\mu$m in thickness is formed on the side walls and the bottom of trench 51. Gate oxide film 59 and oxide mask film 71 are continuous to each other such that gate oxide film 59 and oxide film 71 cover the surface of substrate 50. Oxide mask film 71 left works as an interlayer insulation film together with an interlayer insulation film 65 which will be deposited thereon later.

Figure 7:
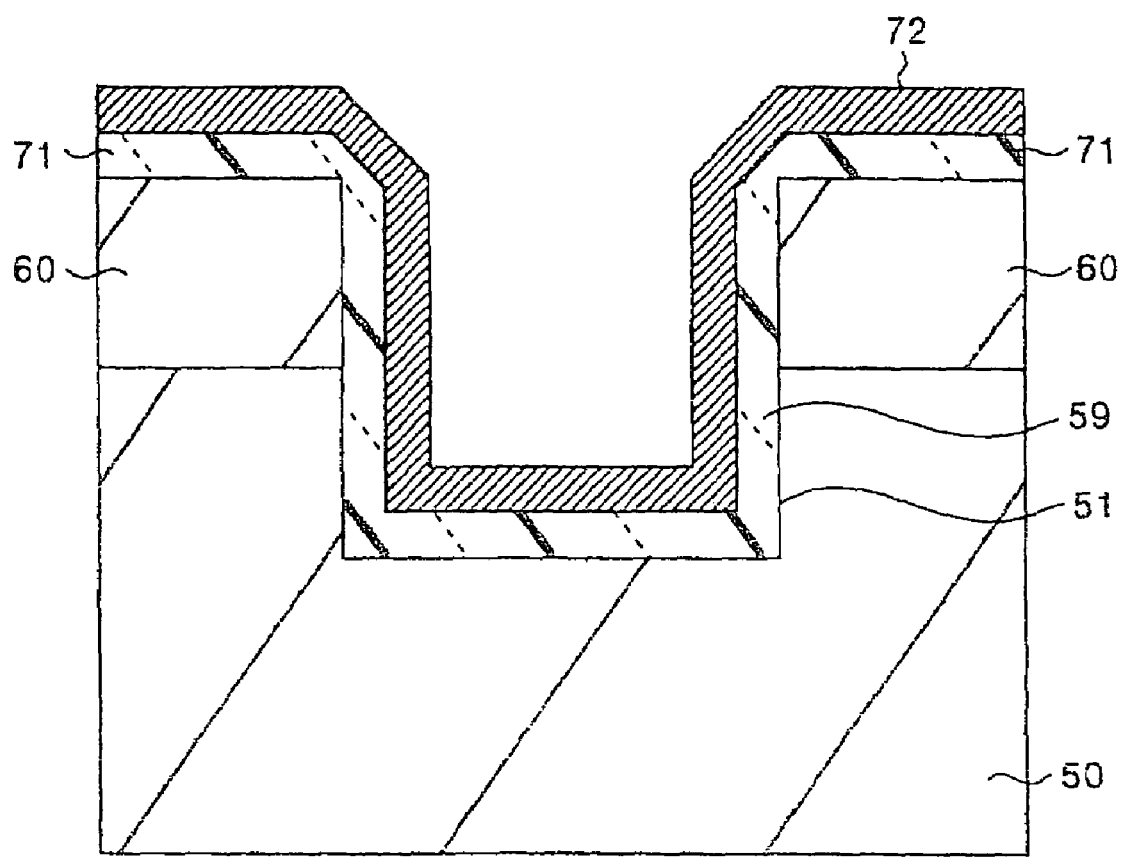

Referring now to FIG. 7, a polycrystalline silicon layer 72 of 0.3 $\mu$m in thickness is deposited on gate oxide film 59 and oxide mask film 71.

Figure 8:
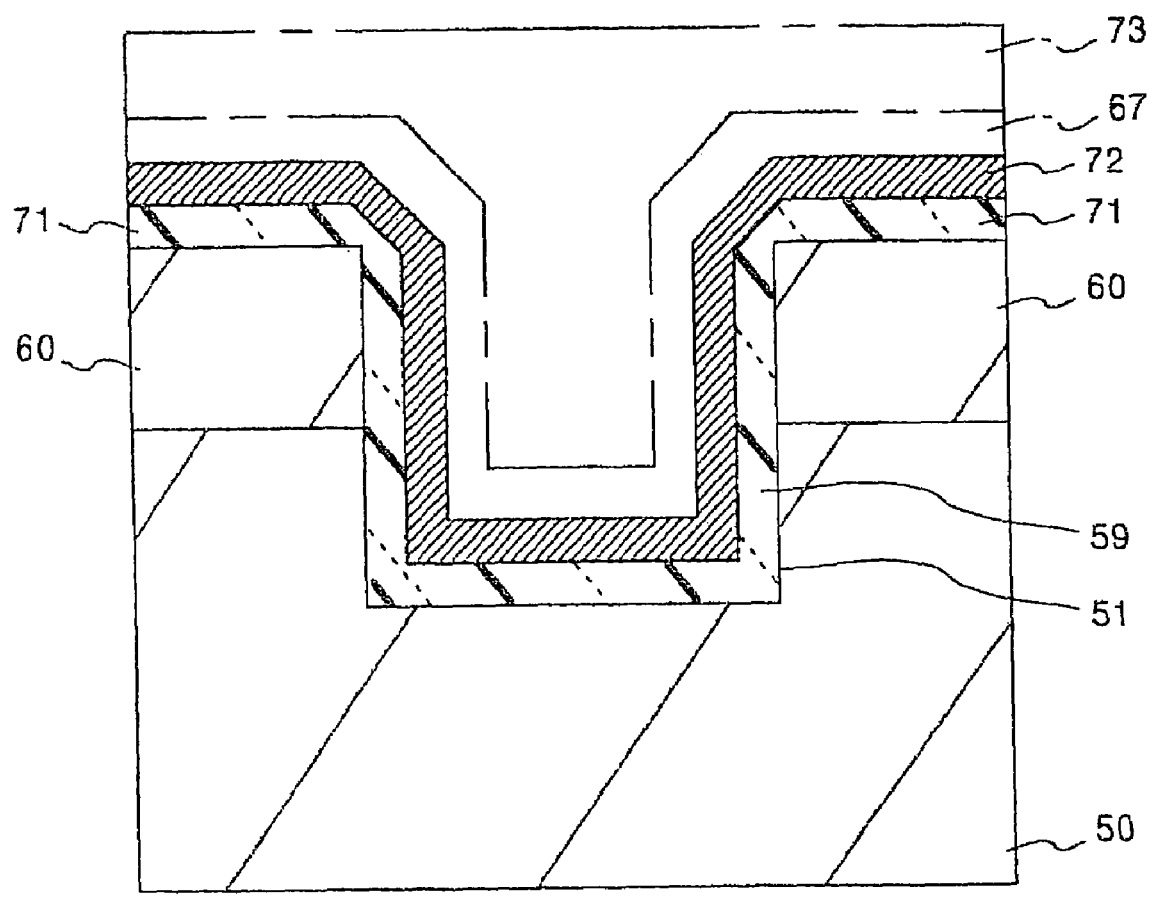

Referring now to FIG. 8, an oxide film (interlayer insulation film) 67 of 0.4 $\mu$m in thickness is deposited on polycrystalline silicon layer 72. A resist mask 73 is formed selectively on the gate region by coating a photoresist, by exposing the coated photoresist and by developing the exposed photoresist. Resist mask 73 is removed from the active region and left on the gate region as a mask. Oxide film 67 is removed selectively using resist mask 73 left. In the active region, polycrystalline silicon layer 72 is exposed by the removal of oxide film 67.

Figure 9:
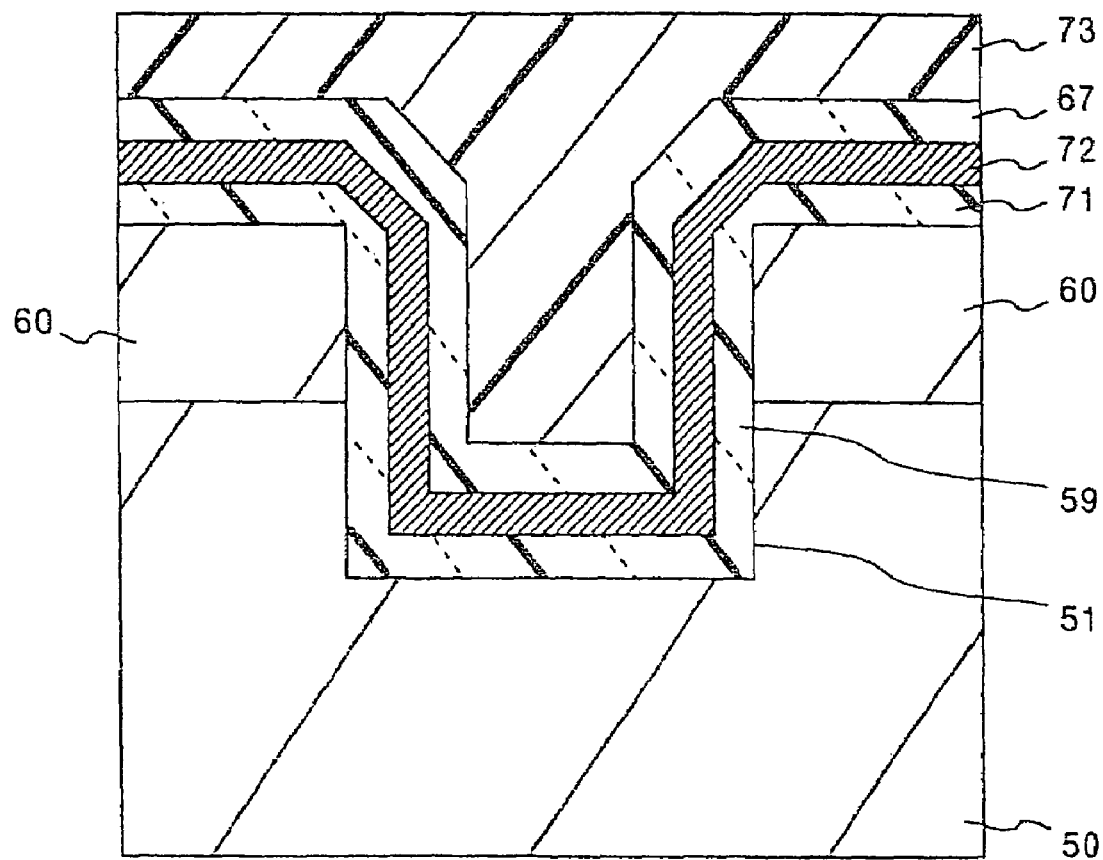

Referring now to FIG. 9, oxide film 67 and resist mask 73 are left in the gate region.

Figure 10:
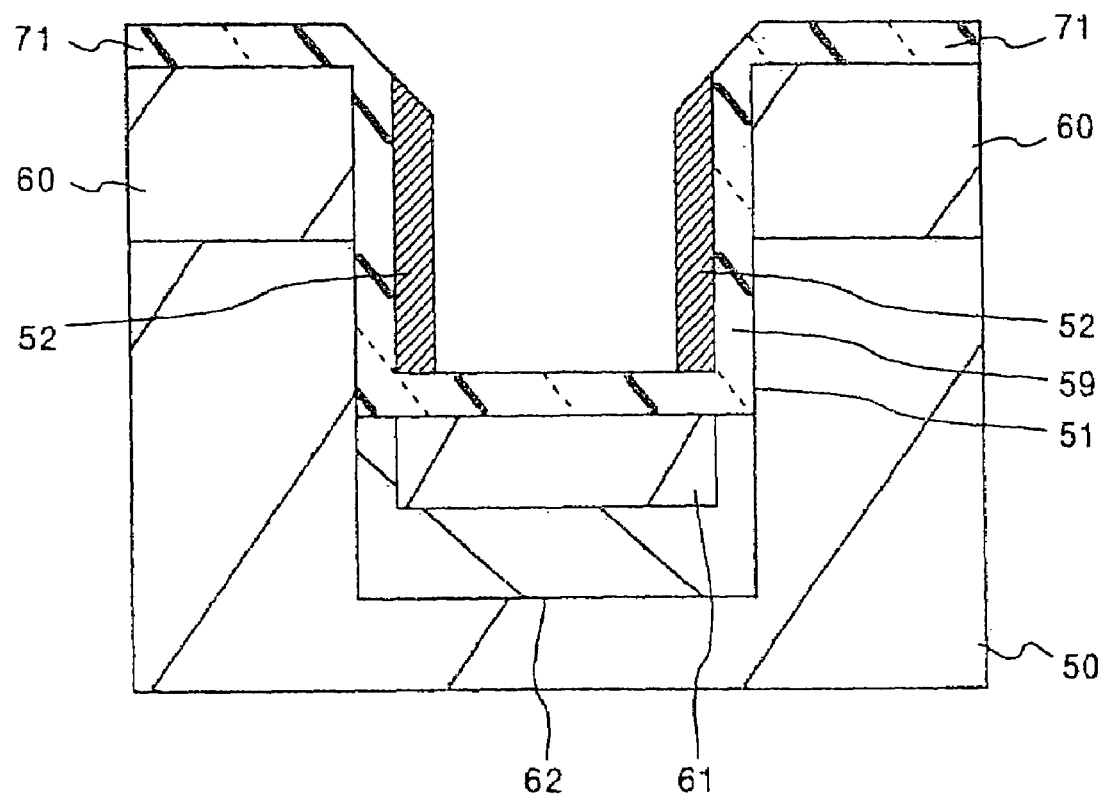

Referring now to FIG. 10, resist mask 73 left is removed. Polycrystalline silicon layer 72 is etched back by anisotropic etching. The anisotropic etching removes polycrystalline silicon layer 72 from the active region except for the side walls of trench 51 with polycrystalline silicon layer 72 left thereon. The polycrystalline silicon layer 72 left works as polycrystalline silicon gate layer 52 in the active region.

Figure 11:
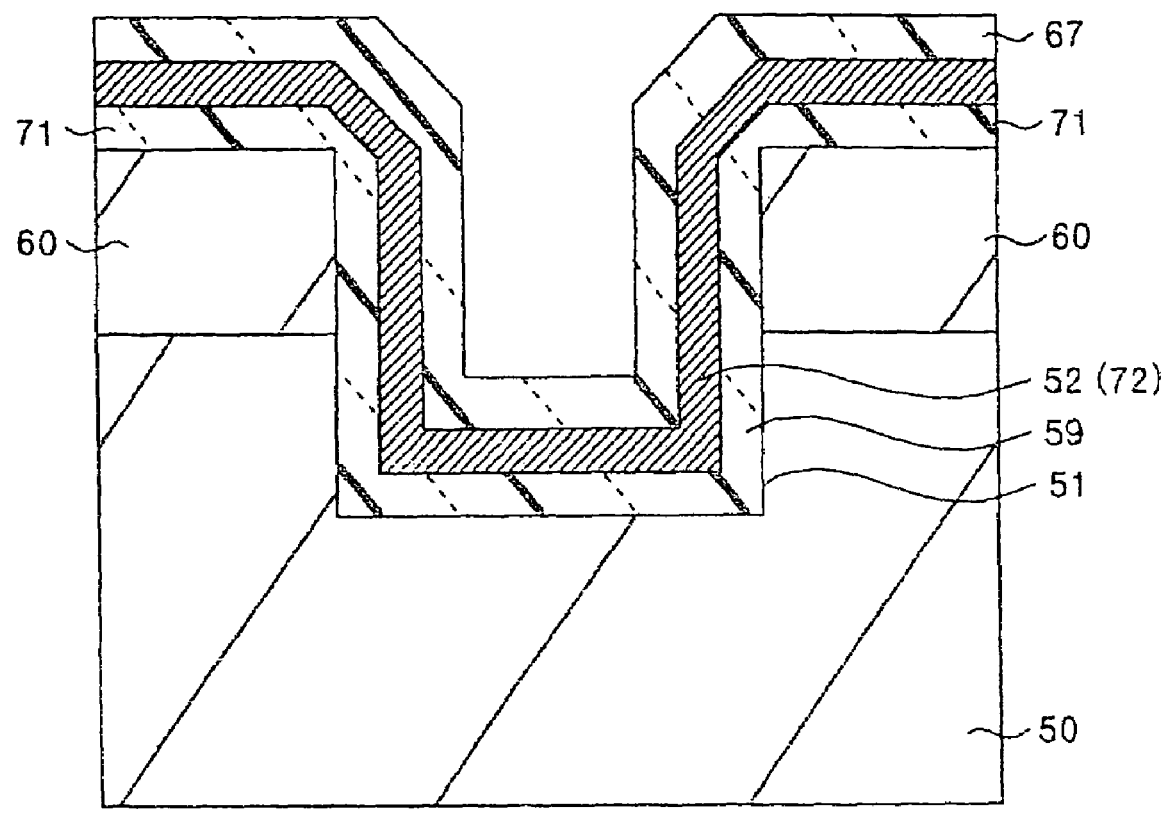

Referring now to FIG. 11, since oxide film 67 prevents etching of polycrystalline silicon layer 72 from causing in the gate region, polycrystalline silicon layer 72 remains in the gate region as polycrystalline silicon gate layer 52.

Referring again to FIG. 10, a p$^-$-type base region 62 and an n$^+$-type diffusion region (source region) 61 are formed by ion implantation into the bottom of trench 51 and by subsequent thermal drive. The diffusion depth of the resulting p$^{\square}$-type base region 62 is 1 $\mu$m. The surface impurity concentration of the resulting p-type base region 62 is $1\times10^{18}$ cm$^{-2}$. The diffusion depth of the resulting n$^+$-type diffusion region 61 is 0.2 $\mu$m. The surface impurity concentration of the resulting n$^+$-type diffusion region 61 is $1\times10^{20}$ cm$^{-2}$. Although not limited to the conditions described below, p$^-$-type base region 62 and n$^+$-type diffusion region 61 are preferably driven at 1100° C. for 10 min.

Figure 12:
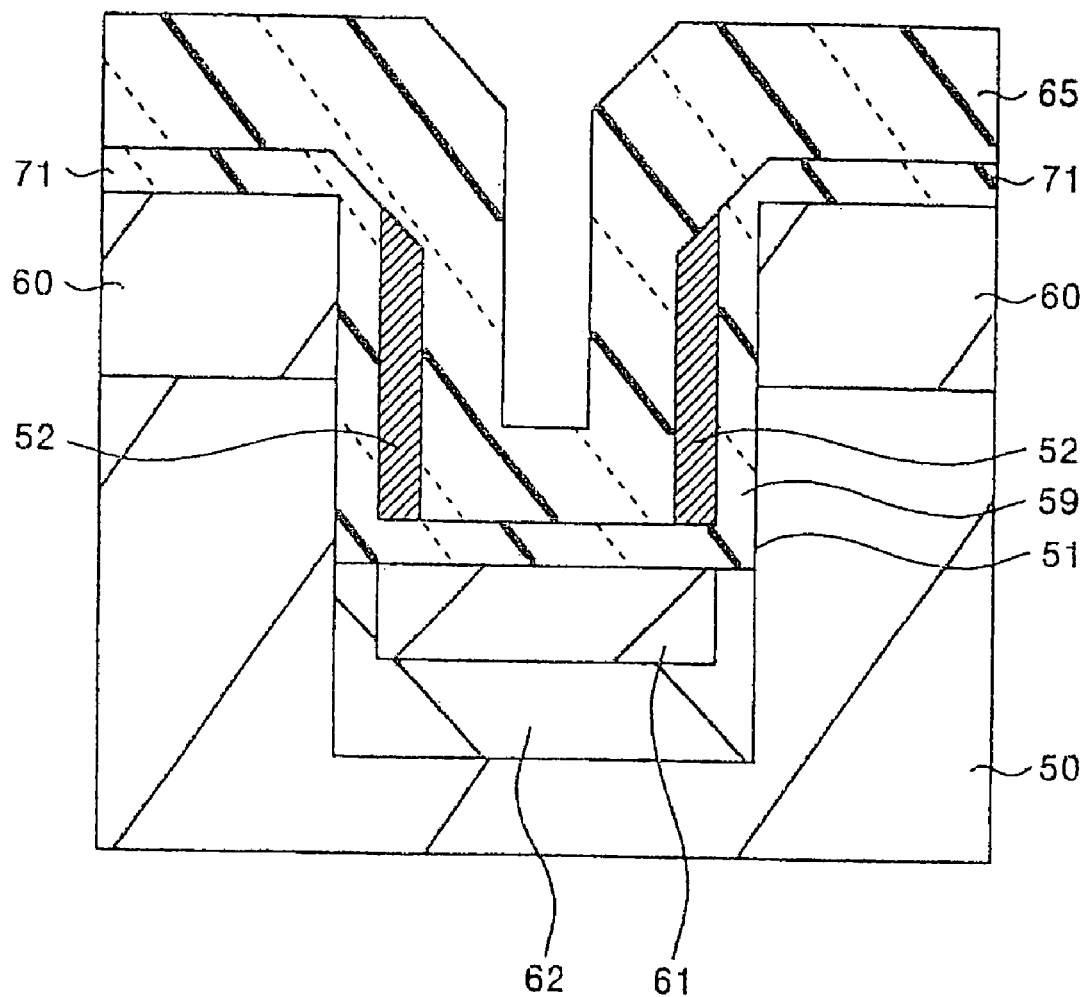
Figure 13:
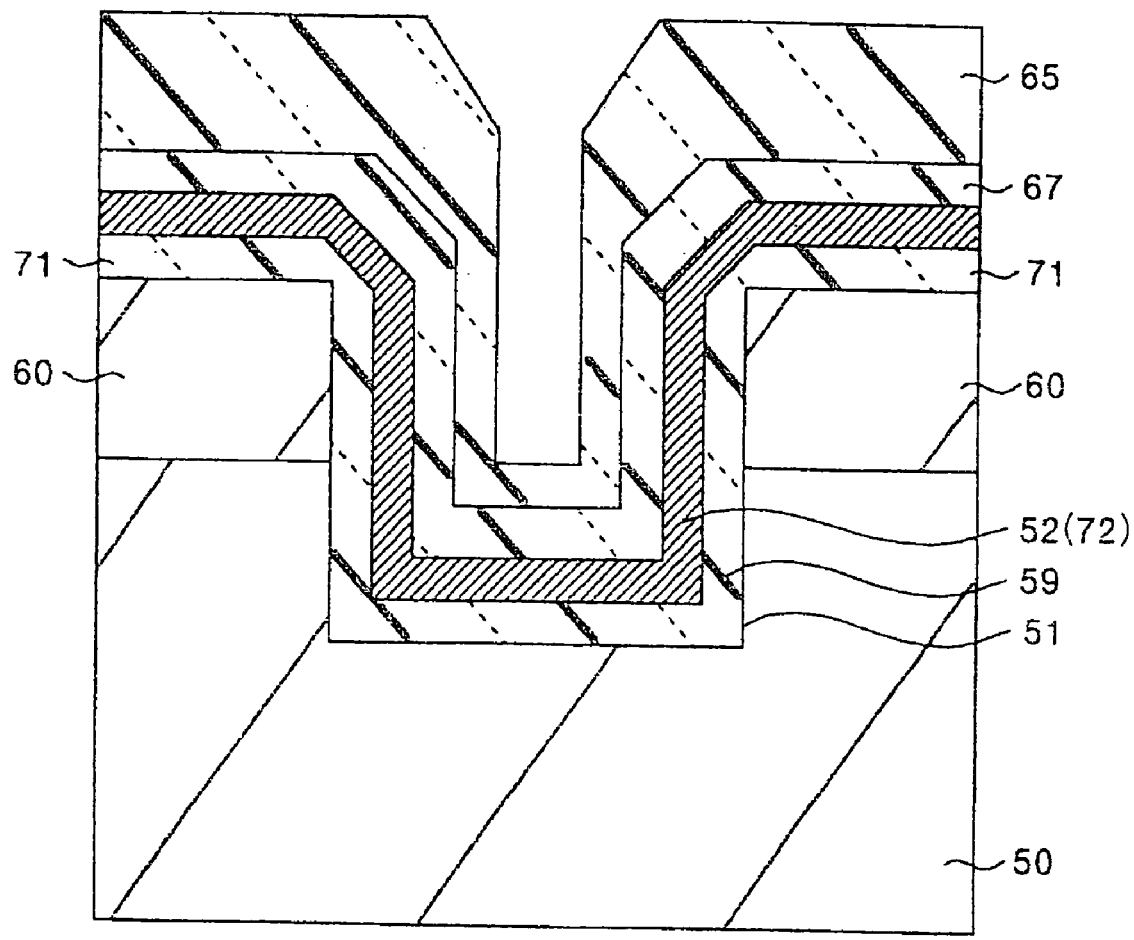

Referring now to FIG. 12 showing the active region and FIG. 13 showing the gate region, an interlayer insulation film 65 is deposited by a film deposition method such as LPCVD at around 400° C. and P-TEOS. By the employment of the film deposition method such as LPCVD and P-TEOS, the growth rate of interlayer insulation film 65 in trench 51 is about half the growth rate of interlayer insulation film 65 outside the trench 51, that is on the substrate surface. Therefore the thickness of interlayer insulation film 65 deposited on the bottom surface of trench 51 is thinner than the thickness of interlayer insulation film 65 on the substrate surface.

Figure 14:
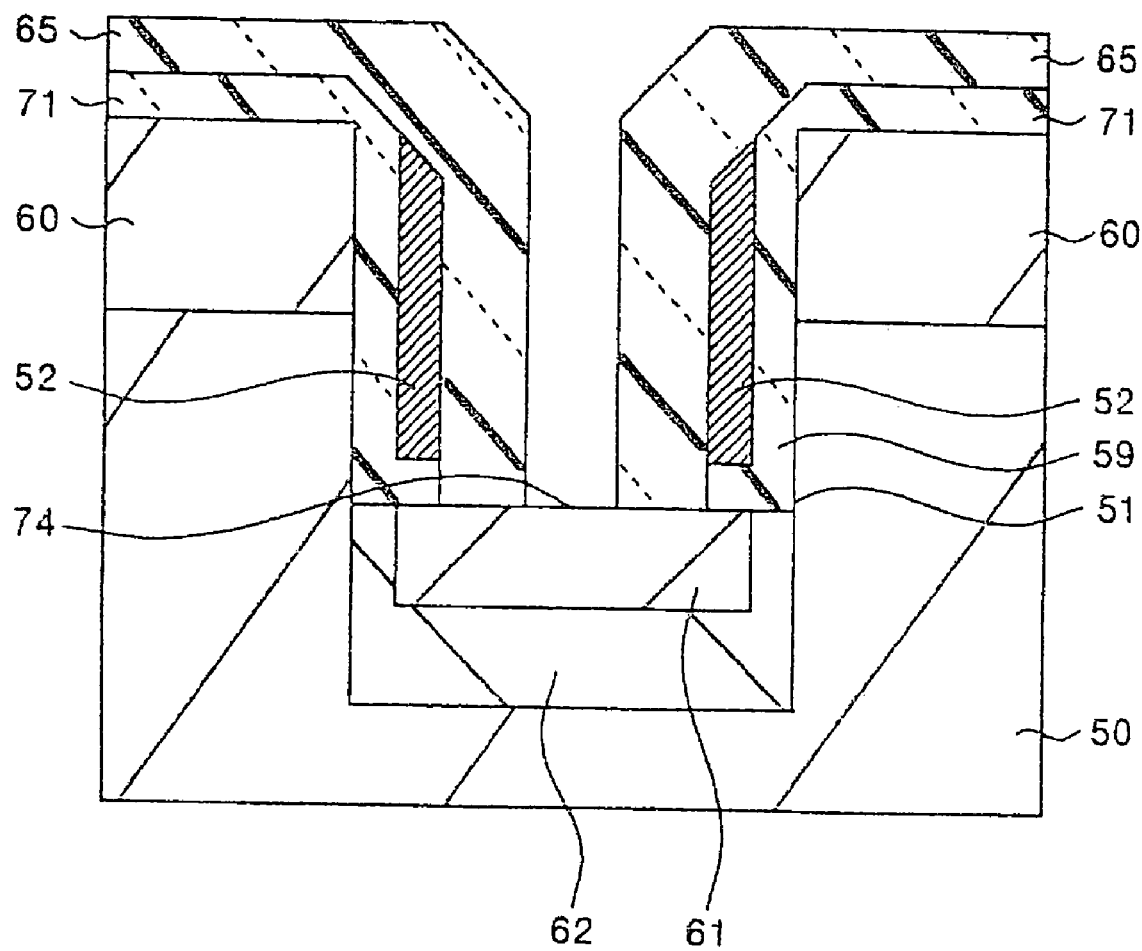
Figure 15:
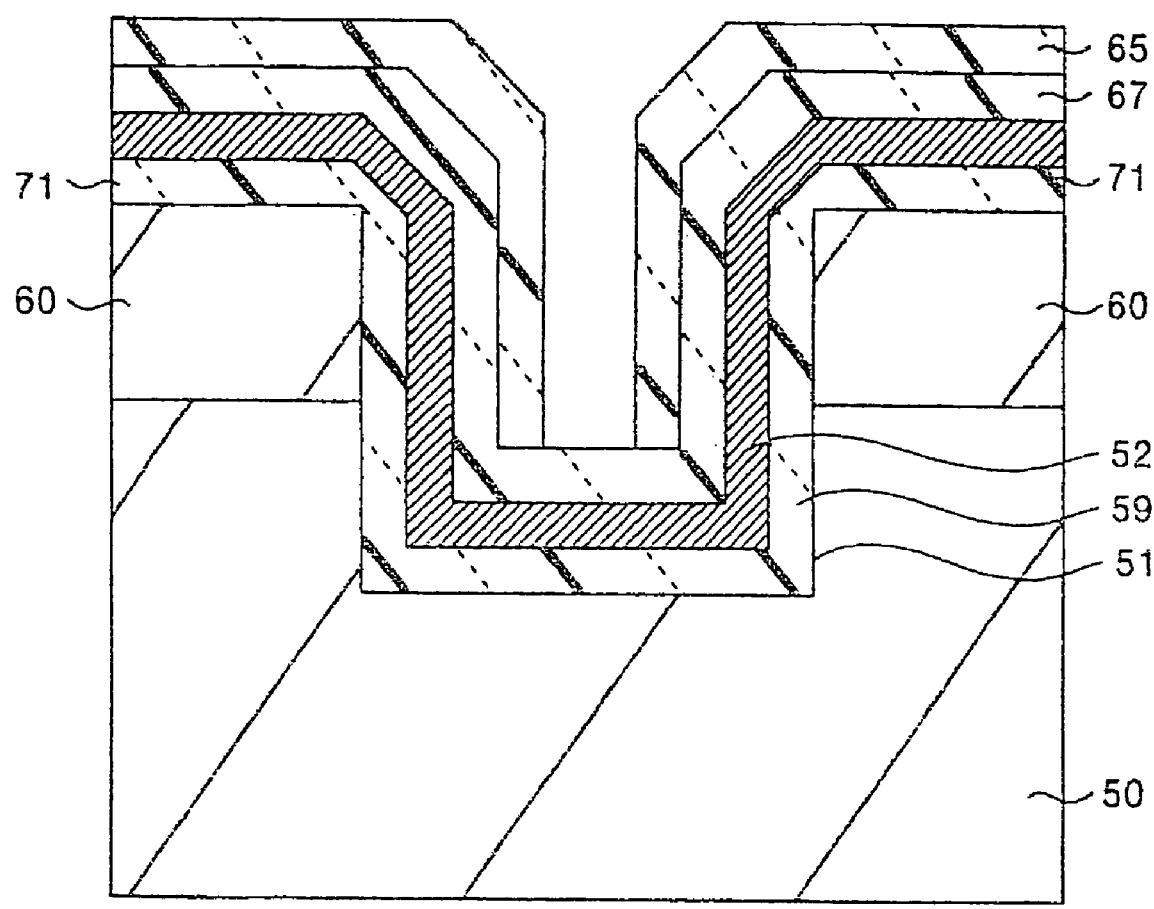

Referring now to FIG. 14 showing the active region and FIG. 15 showing the gate region, a contact hole 74 is bored through interlayer insulation film 65 on the bottom of trench 51 by etching back interlayer insulation film 65 in the active region. Interlayer insulation film 65 remains on the side walls of trench 51 and on the substrate surface outside the trench 51.

Then, trench 51 is filled with a polycrystalline silicon layer 63 by depositing polycrystalline silicon in trench 51 and by etching back the deposited polycrystalline silicon. An interlayer insulation film 66 is deposited on the entire surface of polycrystalline silicon layer 63.

Then, contact holes are bored through interlayer insulation film 66, interlayer insulation film 65 (including oxide mask film 71), and interlayer insulation film 67 by photolithography and by etching. After forming an n$^+$-type diffusion region 58 which will be a drain region, a gate electrode 53, a source electrode 54 and a gate electrode 55 are formed by pattering a deposited metal film. Thus, a trench-type lateral power MOSFET 1 including an active region having a cross sectional structure shown in FIG. 2 and a gate region having a cross sectional structure shown in FIG. 3 is obtained.

Figure 23:
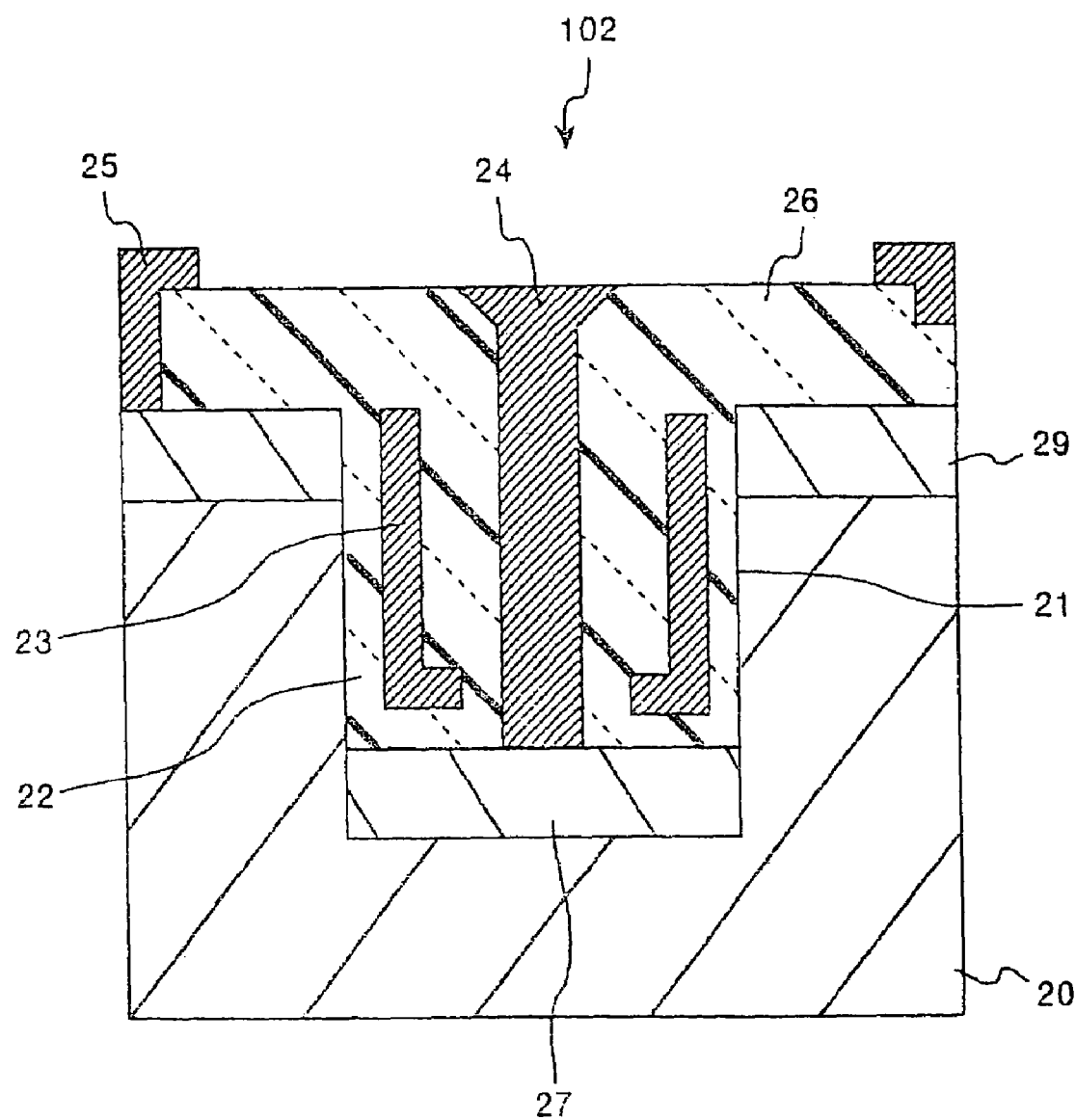
FIG. 23 is a cross sectional view of a conventional trench-type MOSFET.

According to the first embodiment of the invention, n$^-$-type diffusion region (drift region) 60 and the channel region, which should be spaced apart from each other for a certain spacing to obtain a high breakdown voltage, are aligned vertically alongside trench 51, and the device pitch is determined by the spacing between centers of the source contact region and the drain contact region. Therefore, the trench-type lateral power MOSFET according to the first embodiment facilitates providing a device pitch shorter than the device pitch of the conventional lateral power MOSFET for the breakdown voltage of lower than 80 V. According to the second embodiment, a MOSFET structure is self aligned alongside trench 51. Therefore, the trench-type lateral power MOSFET manufactured by the method according to the second embodiment facilitates shortening the device pitch without positioning the masks so precisely. The effect of the shortened device pitch is more remarkable as the structure of the trench-type lateral power MOSFETs becomes finer. By virtue of the provision of p$^-$-type base region 62, the punch-trough breakdown voltage and the on-breakdown voltage (the breakdown voltage when a voltage is applied to the gate electrode) are higher than those of the conventional trench-type MOSFET shown in FIG. 23.

Figure 22:
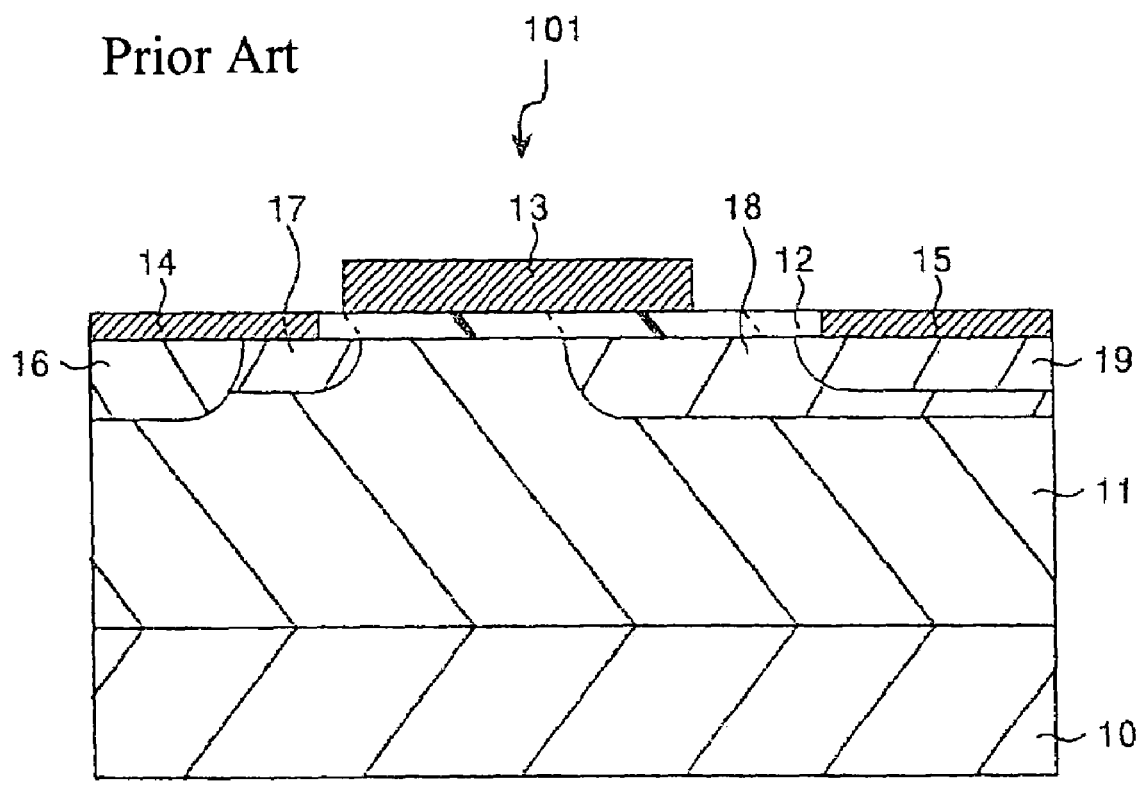
FIG. 22 is a cross sectional view of a conventional lateral power MOSFET for the breakdown voltage class of 30 V.

The device pitch on the bases of the 1 $\mu$m rule is 3.0 $\mu$m in trench-type lateral power MOSFET 1 according to the first embodiment and 5.61 $\mu$m in the conventional lateral power MOSFET shown in FIG. 22, the breakdown voltage thereof is lower than 80 V. The device pitch on the bases of the 0.6 $\mu$m rule is 1.8 $\mu$m in trench-type lateral power MOSFET 1 and 4.4 $\mu$m in the conventional lateral power MOSFET. And, the device pitch on the bases of the 0.35 $\mu$m rule is 1.05 $\mu$m in trench-type lateral power MOSFET 1 and 3.6 $\mu$m in the conventional lateral power MOSFET.

Since trench-type lateral power MOSFET 1 based on any of the rules described above exhibits the current driving capability per unit device almost the same with that of the conventional lateral power MOSFET, the channel width per unit area is narrowed greatly. The channel width per unit area on the basis of the 1 $\mu$m rule in trench-type lateral power MOSFET 1 is narrowed to 54% of that in the conventional lateral power MOSFET. The channel width per unit area on the basis of the 0.6 $\mu$m rule in trench-type lateral power MOSFET 1 is narrowed to 41% of that in the conventional lateral power MOSFET. And, the channel width per unit area on the basis of the 0.35 $\mu$m rule in trench-type lateral power MOSFET 1 is narrowed to 30% of that in the conventional lateral power MOSFET. Therefore, the on-resistance per unit area of the trench-type lateral power MOSFET according to the first embodiment exhibiting a breakdown voltage of 30 V, is 15 m$\Omega$/mm$^2$ on the basis of 1 $\mu$m rule, 11 m$\Omega$/mm$^2$ on the basis of 0.6 $\mu$m rule, and 8 m$\Omega$/mm$^2$ on the basis of 0.35 $\mu$m rule.

Figure 24:
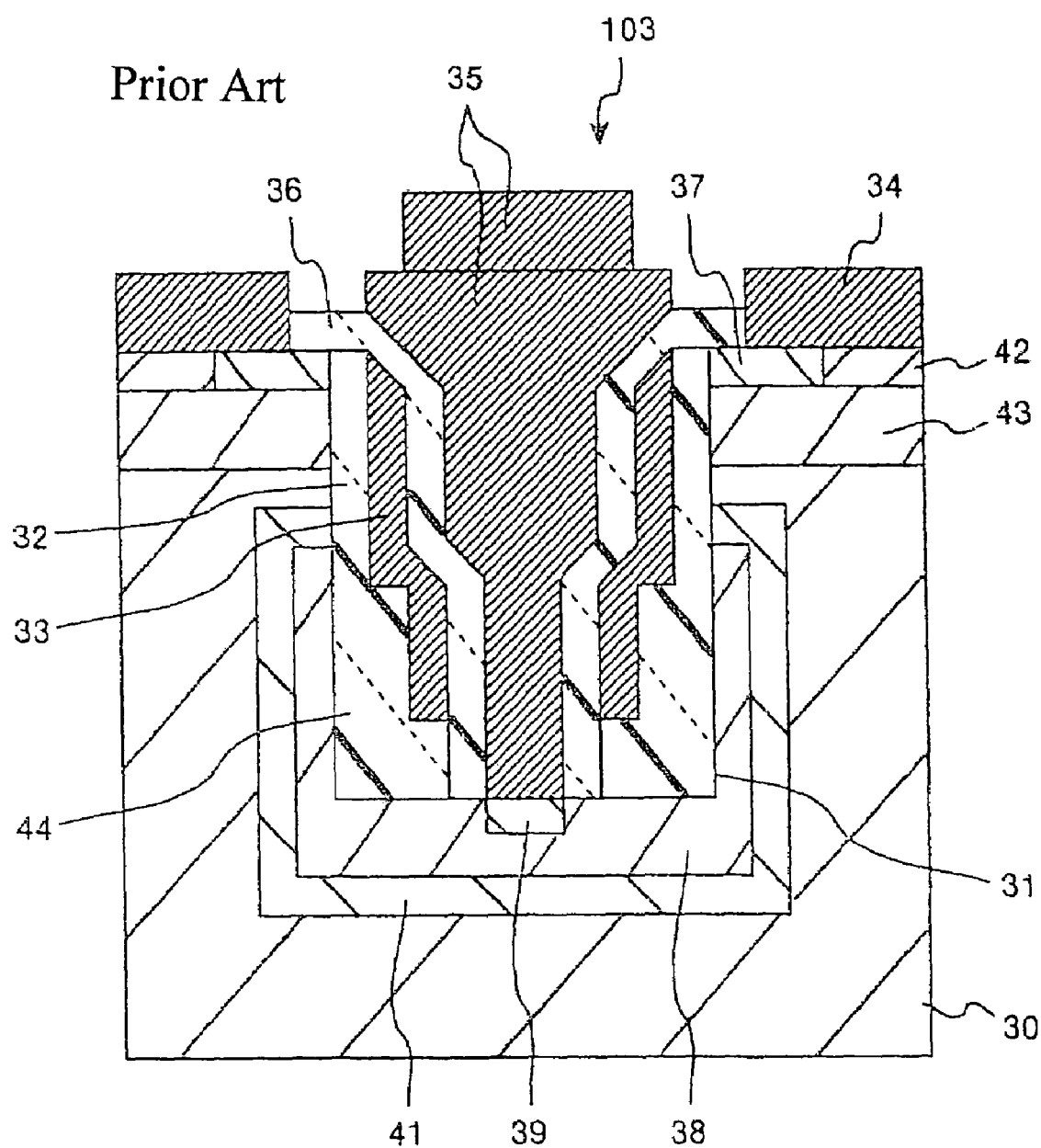
FIG. 24 is a cross sectional view of a conventional trench-type lateral power MOSFET.

For obtaining a designed breakdown voltage, it is not necessary to provide the trench-type lateral power MOSFET according to the first embodiment with the thick oxide film as provided to the conventional trench-type lateral power MOSFET shown in FIG. 24 for the breakdown voltage of 80 V. Therefore, the gate area and the device size of the trench-type lateral power MOSFET according to the first embodiment are smaller than those of the conventional trench-type lateral power MOSFET. Thus, the problems such as the wiring resistance increase and the driving loss increase, which will be caused by applying the structure of the conventional trench-type lateral power MOSFET with the breakdown voltage of 80 V to trench-type lateral power MOSFETs for the breakdown voltage of 30 V, are avoided.

In manufacturing the trench-type lateral power MOSFET by the method according to the second embodiment of the invention, trench etching is conducted only once. Therefore, the trench-type lateral power MOSFET according to the first embodiment is manufactured through the process simpler than the process for manufacturing the conventional trench-type lateral power MOSFET for the breakdown voltage of 80 V, in which trench etching is conducted twice. Therefore, the throughput of manufacturing the trench-type lateral power MOSFET according to the invention is prevented from being impaired.

Figure 16:
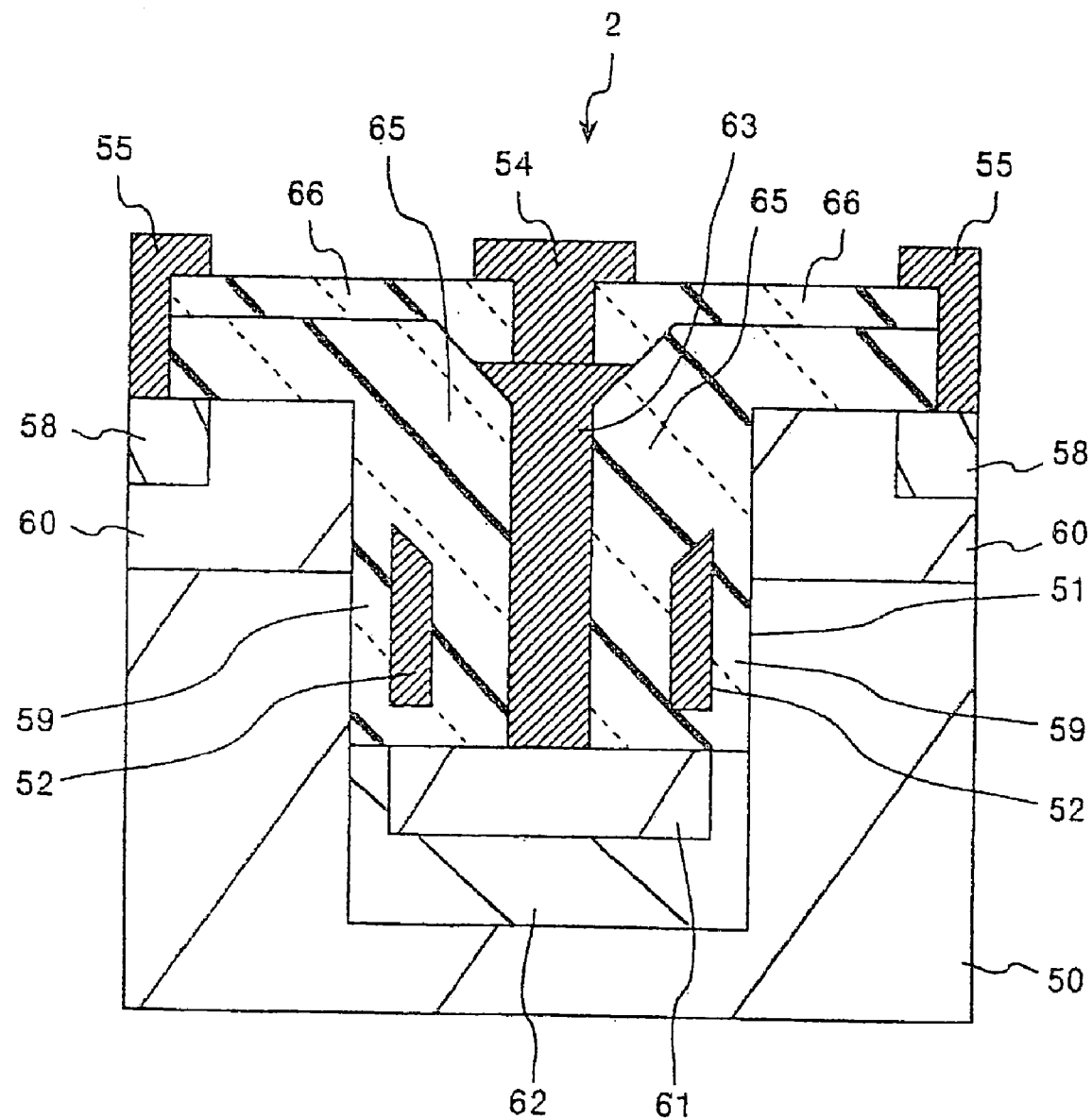
FIG. 16 is a cross sectional view of a trench-type lateral power MOSFET according to a third embodiment of the invention.
Figure 17:
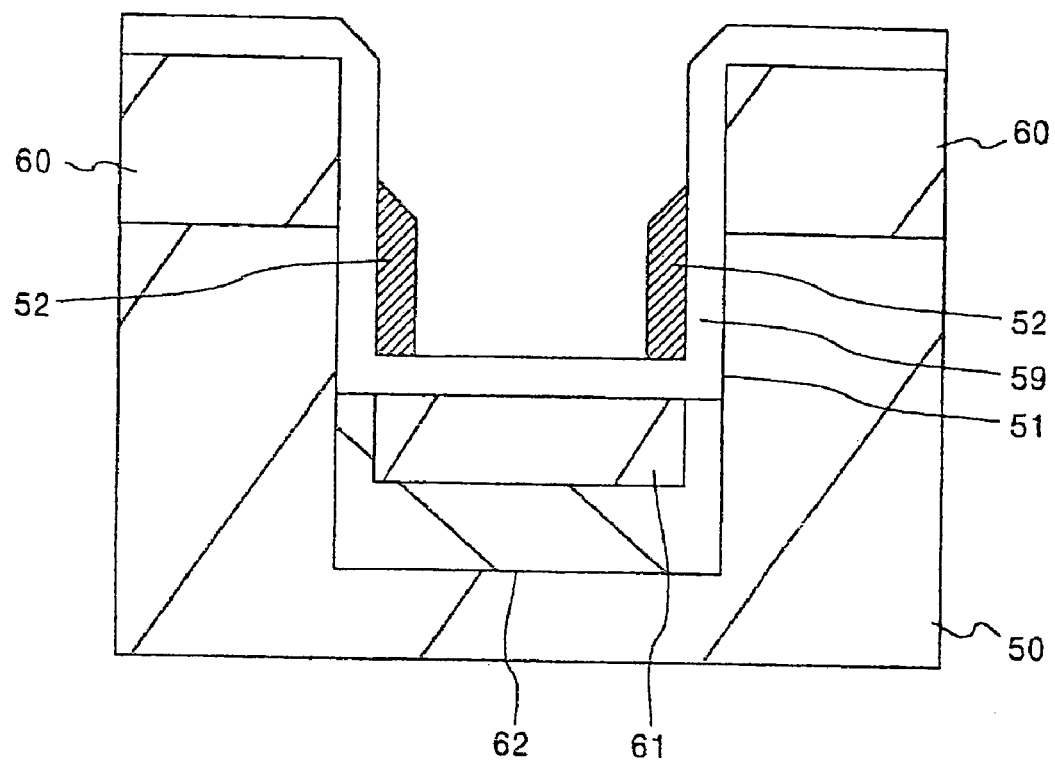
FIG. 17 is a cross sectional view showing the step of forming a polycrystalline silicon gate layer of the trench-type lateral power MOSFET according to the third embodiment shown in FIG. 16.

Various modifications are obvious without departing from the concept of the invention. FIG. 16 is a cross sectional view of a trench-type lateral power MOSFET 2 according to a third embodiment of the invention. Referring now to FIG. 16, trench-type lateral power MOSFET 2 according to the third embodiment includes a polycrystalline silicon gate layer 52 not over the entire depth of a trench 51 but in the lower half of trench 51. This polycrystalline silicon gate layer 52 is formed, as shown in FIG. 17, by over etching poly crystalline silicon layer 72 deposited on a gate oxide film 59.

Since n$^+$-type diffusion region (drain region) 58 and polycrystalline silicon gate layer 52 are spaced apart widely from each other, MOSFET 2 shown in FIG. 16 facilitates preventing the electric field from localizing to the vicinity of the gate edge on the drain side. The electric field is prevented from localizing even when gate oxide film 59 is thinner to obtain a finer structure in MOSFET 2. Therefore, the trench-type lateral power MOSFET according to the third embodiment facilitates obtaining a higher breakdown voltage. Or, the trench-type lateral power MOSFET according to the third embodiment facilitates maintaining the same breakdown voltage even when the structure thereof is finer. For example, the breakdown voltage BVds of 30V or higher is obtained by over etching polycrystalline silicon layer 72 for 0.5 µm.

The spacing between the n$^+$-type diffusion region 58 and polycrystalline silicon gate layer 52 in the lower half of trench 51 as shown in FIG. 16, is wider than the spacing between the n$^+$-type diffusion region 58 and polycrystalline silicon gate layer 52 extending from the upper half to the lower half of trench 51.

Figure 18:
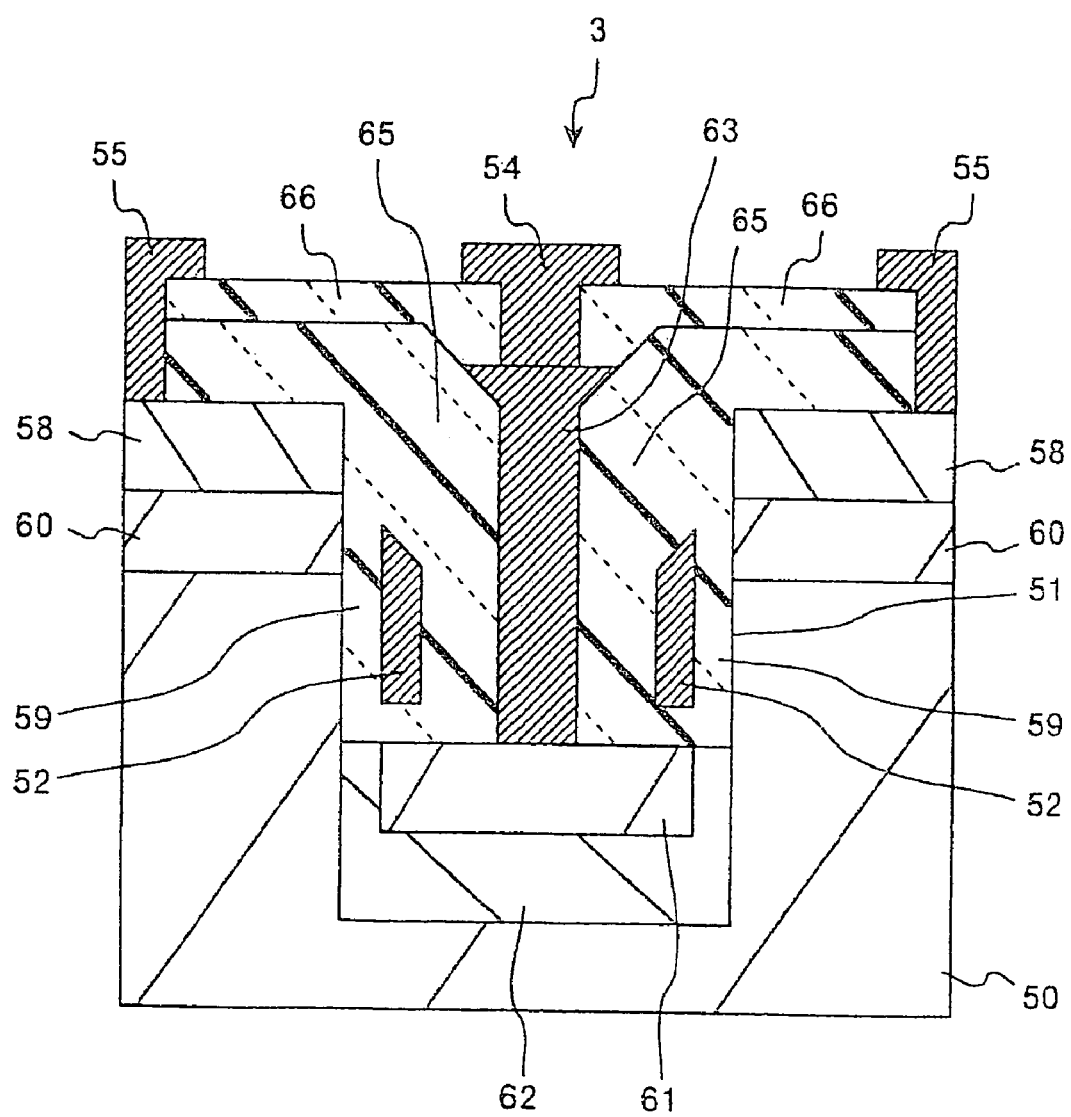
FIG. 18 is a cross sectional view of a trench-type lateral power MOSFET according to a fourth embodiment of the invention.

The trench-type lateral power MOSFET 3 according to a fourth embodiment of the invention, which includes an n$^+$-type diffusion region 58 (drain region) in contact with a trench 51 as shown in FIG. 18, also facilitates obtaining a high breakdown voltage as far as polycrystalline silicon gate layer 52 is in the lower half of trench 51. Therefore trench-type lateral power MOSFET 3 according to the fourth embodiment facilitates narrowing the spacing between the trenches and increasing the number of unit devices integrated or the density of integration.

Figure 19:
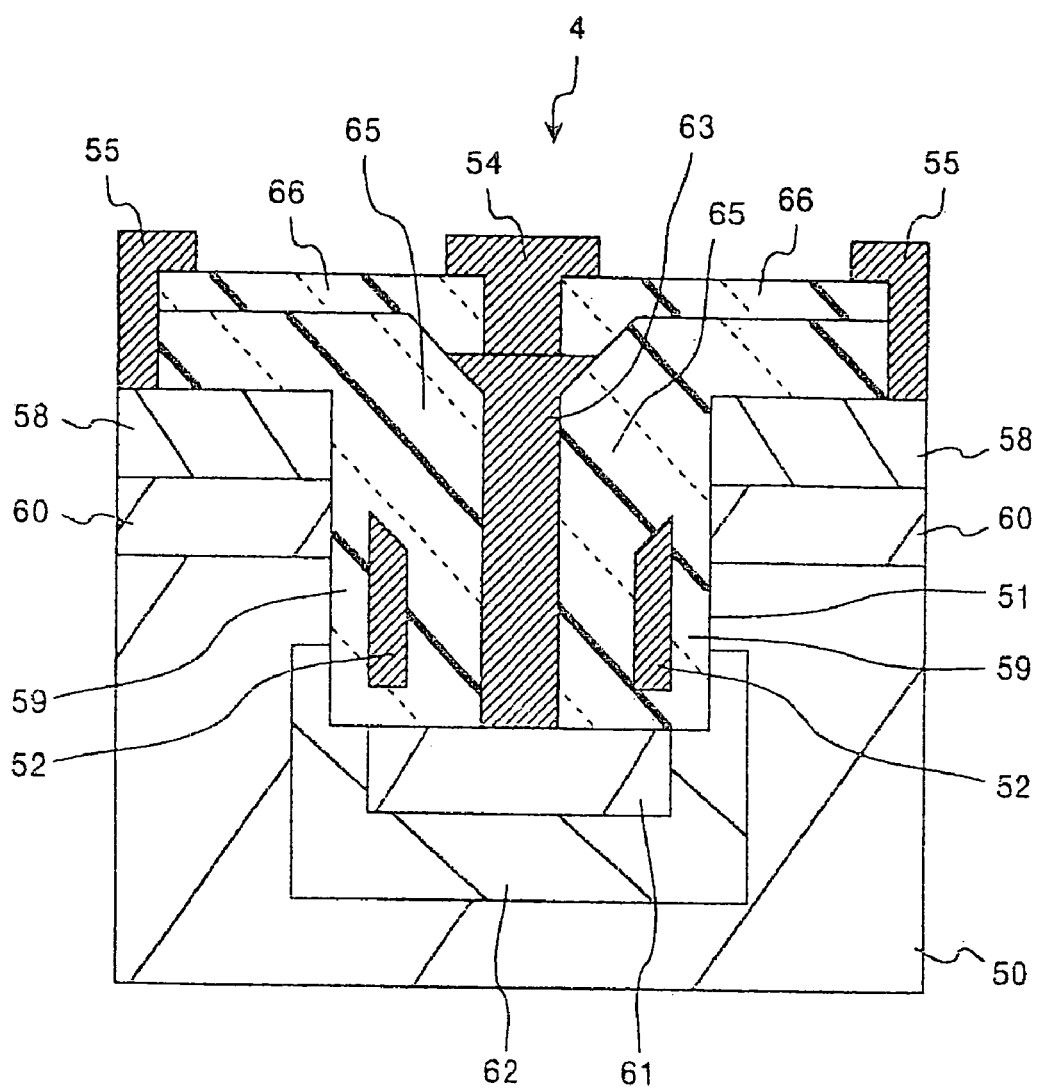
FIG. 19 is a cross sectional view of a trench-type lateral power MOSFET according to a fifth embodiment of the invention.

FIG. 19 is a cross sectional view of a trench-type lateral power MOSFET according to a fifth embodiment of the invention. The trench-type lateral power MOSFET 4 according to the fifth embodiment includes a p$^-$-type base region 62, the diffusion depth thereof is 2 µm, twice as thick as that according to any of the embodiments described above. The p$^-$-type base region 62, the diffusion depth thereof is 2 µm is formed, for example, by elongating the thermal drive time to 40 min. Since p$^-$-type base region 62 becomes wider than the trench width, the punch-through breakdown voltage is improved.

Figure 20:
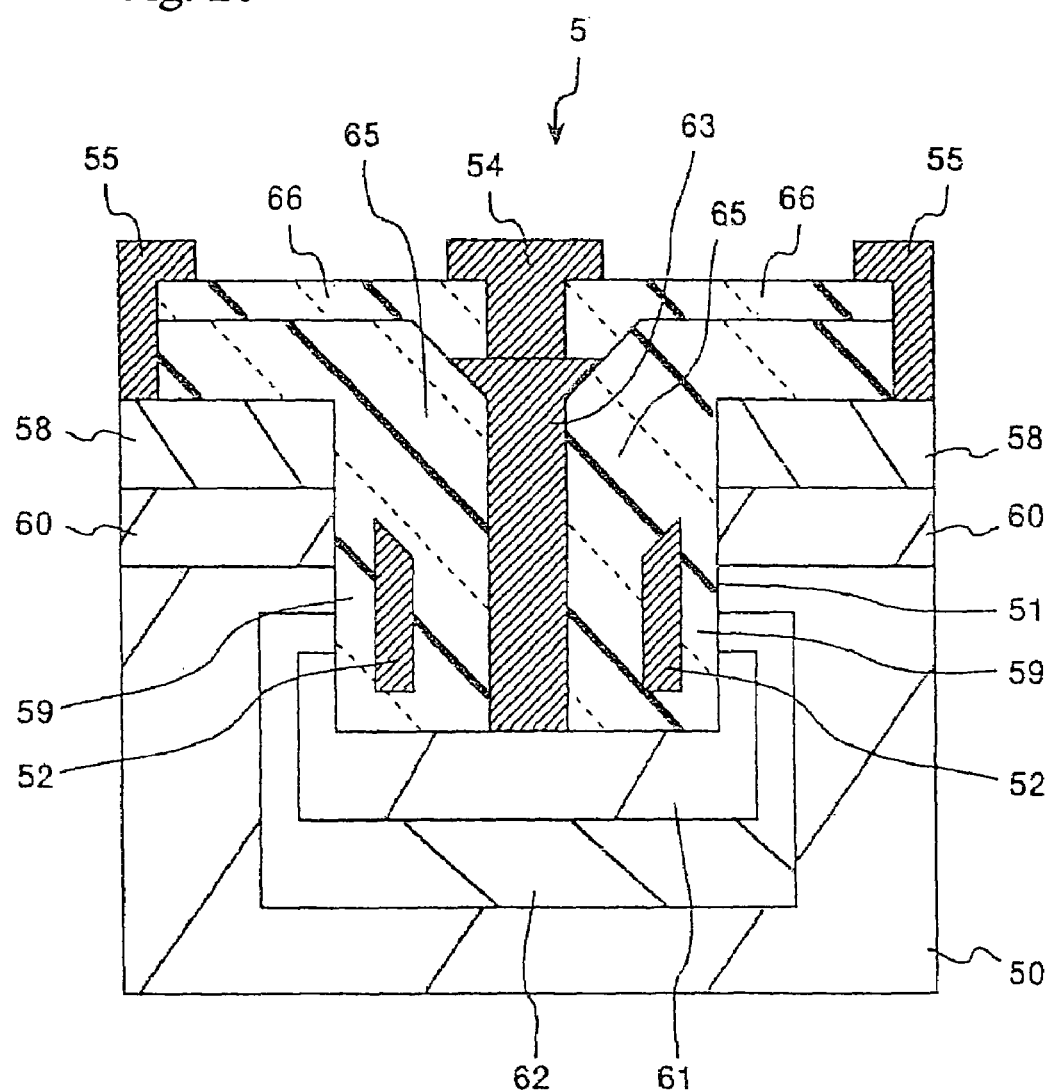
FIG. 20 is a cross sectional view of a trench-type lateral power MOSFET according to a sixth embodiment of the invention.

FIG. 20 is a cross sectional view of a trench-type lateral power MOSFET according to a sixth embodiment of the invention. Referring now to FIG. 20, the trench-type lateral power MOSFET 5 according to the sixth embodiment includes an n$^+$-type diffusion region 61 covering the corner portions of the bottom of a trench 51. This n$^+$-type diffusion region 61 is preferably formed by elongating the thermal drive time to 40 min, by changing the ion species doped in the n$^+$-type source region from arsenic to phosphorus, and by adjusting the diffusion depth to 1 µm. In trench-type lateral power MOSFET 5, only the channel region and the drift region are aligned alongside trench 51.

In the corner portions of the trench bottom, the mobility in the channel region is low, the current driving capability is insufficient, and leakage current increase is caused when a voltage as high as the breakdown voltage is applied between the source and the drain in the OFF-state of the MOSFET due to the crystal defects caused by the stress caused during the growth of the gate oxide film. The trench-type lateral power MOSFET 5 according to the sixth embodiment facilitates obviating these problems. Therefore, the structure according to the sixth embodiment is effective to obtain a high current driving capability or to reduce the leakage current.

Figure 21:
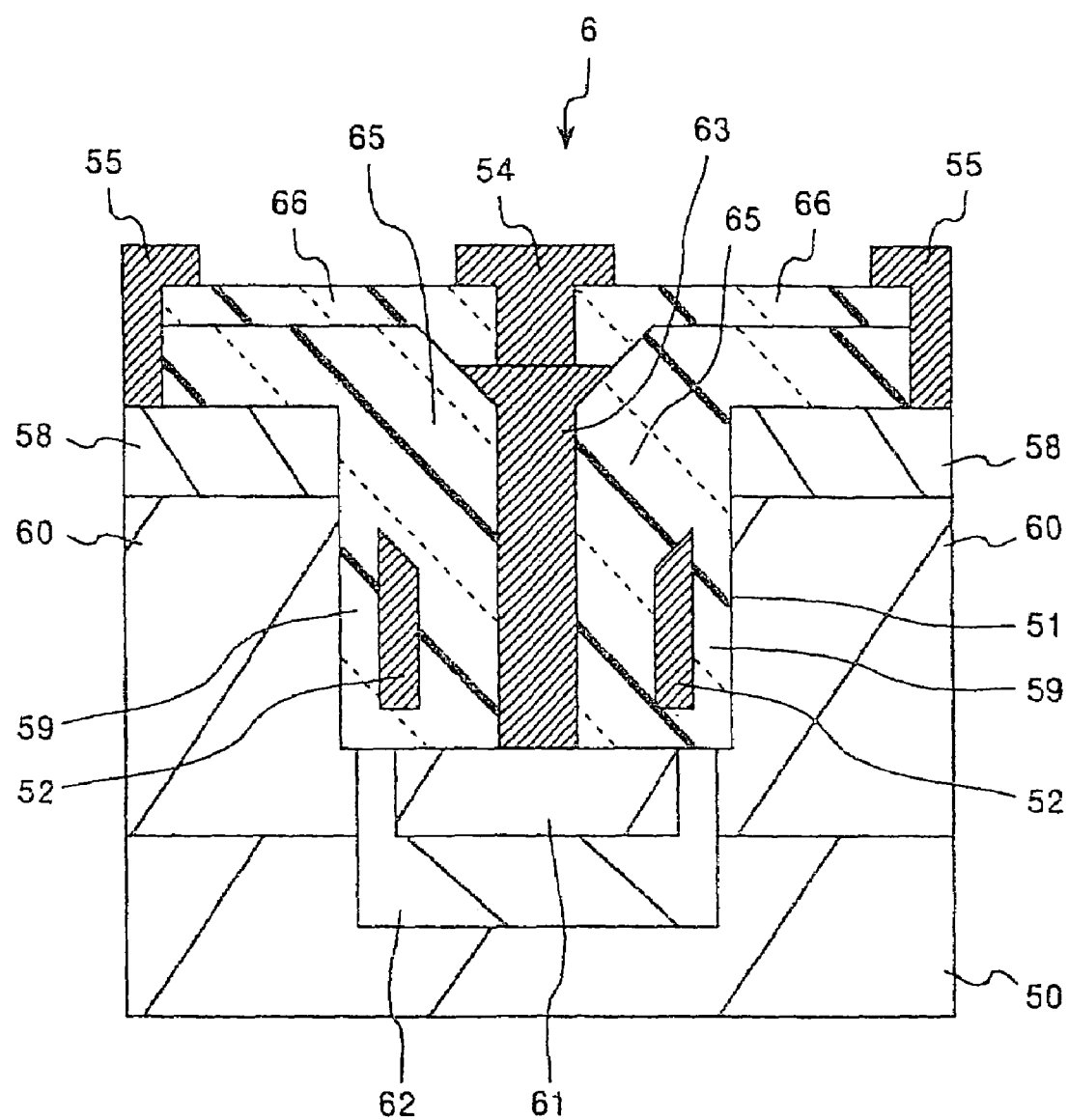
FIG. 21 is a cross sectional view of a trench-type lateral power MOSFET according to a seventh embodiment of the invention.

FIG. 21 is a cross sectional view of a trench-type lateral power MOSFET according to a seventh embodiment of the invention. In the trench-type lateral power MOSFET 6 according to the seventh embodiment, the diffusion depth of n$^-$-type diffusion region (n$^-$-type drift region) 60 is elongated such that n$^-$-type diffusion region (n$^-$-type drift region) 60 is extended to the bottom level of the trench. Since this structure shortens the channel length, switching is conducted at high speed and at low on-resistance.

According to the invention, the drift region and the channel region, which should be spaced apart from each other for a certain spacing to obtain a high breakdown voltage, are aligned vertically alongside trench 51, and the device pitch is determined by the spacing between the centers of the source contact region and the drain contact region. Therefore, the trench-type lateral power MOSFET according to the invention for the low breakdown voltage facilitates providing a device pitch shorter than the device pitch of the conventional lateral power MOSFET for the breakdown voltage of lower than 80 V. Since the MOSFET structure is self aligned alongside the trench, the trench-type lateral power MOSFET according to the invention facilitates shortening the device pitch and improving the density of integration without positioning the masks so precisely.

For obtaining a high breakdown voltage, it is not necessary to provide the trench-type lateral power MOSFET according to the invention with the thick oxide film as provided to the conventional trench-type lateral power MOSFET for the breakdown voltage of 80 V. Since the gate area and the device size of the trench-type lateral power MOSFET according to the invention are smaller than those of the conventional trench-type lateral power MOSFET, the parasitic capacitance between the substrate and the device is reduced. Since the gate wiring, the source wiring and the drain wiring are short, the parasitic wiring resistance is reduced. Therefore, high speed switching is realized and the switching loss is reduced more effectively by the trench-type lateral power MOSFET according to the invention for the breakdown voltage of 30 V than by the trench-type lateral power MOSFET for the breakdown voltage of 30 V, to which the structure of the conventional trench-type lateral power MOSFET for the breakdown voltage of 80 V is applied. Furthermore, the adverse effects of noises to the adjacent unit devices are reduced.

In manufacturing the trench-type lateral power MOSFET by the method according to the invention, trench etching is conducted only once. Therefore, the trench-type lateral power MOSFET according to the invention is manufactured through the process simpler than the process for manufacturing the conventional trench-type lateral power MOSFET having a breakdown voltage of 80 V, in which trench etching is conducted twice. Therefore, the throughput of manufacturing the trench-type lateral power MOSFET according to the invention is improved.

What is claimed:

1. A method of manufacturing a semiconductor device comprising the steps of:

forming a drift region of a second conductivity type on a semiconductor substrate of a first conductivity type;

removing selectively a part of the drift region and a part of the semiconductor substrate, whereby to form trenches;

forming a gate insulation film with uniform thickness along the inner side walls and the bottom surface of each trench;

forming a first electrical conductor on the gate insulation film;

forming an oxide film on the first electrical conductor;

removing selectively the region of the oxide film corresponding to an active region, whereby to expose the first electrical conductor in the region corresponding to the active region;

etching back the first electrical conductor in the region corresponding to the active region such that the first electrical conductor is remaining along the side walls of the trench;

forming a base region of the first conductivity type and a source region of the second conductivity type in the bottom portion of the trench;

forming a first interlayer insulation film in the trench;

removing the bottom portion of the first interlayer insulation film in the region corresponding to the active region and the portion of the gate insulation film below the removed bottom portion of the first interlayer insulation film, whereby to expose the source region; and forming a second electrical conductor in the trench, the second electrical conductor being connected electrically to the source region.

2. The method according to claim 1, further comprising the steps of:

forming a drain region of the second conductivity type in the surface portion of the drift region;

forming a second interlayer insulation film on the surface of the semiconductor substrate;

boring contact holes in the first interlayer insulation film and the second interlayer insulation film;

forming a gate electrode connected electrically to the first electrical conductor;

forming a source electrode connected electrically to the second electrical conductor; and forming a drain electrode connected electrically to the drain region.

3. The method according to claim 1, wherein the step of etching back comprises over etching the first electrical conductor in the region corresponding to the active region such that the upper end face of the first electrical conductor is positioned at a level lower than the surface of the semiconductor substrate.

* * * * *